United States Patent [19]

Shimada

[11] Patent Number: 5,509,040
[45] Date of Patent: Apr. 16, 1996

[54] FREQUENCY DIVIDER

[75] Inventor: Masaaki Shimada, Itami, Japan

[73] Assignee: Mitsubishi Denki Kabushiki Kaisha, Tokyo, Japan

[21] Appl. No.: 279,101

[22] Filed: Jul. 22, 1994

[30] Foreign Application Priority Data

Jul. 23, 1993 [JP] Japan .................................. 5-182415

[51] Int. Cl.[6] ................................. H03K 23/40
[52] U.S. Cl. ...................... 377/117; 377/121; 377/106; 327/118
[58] Field of Search ................... 377/105, 106, 377/117, 121; 327/118

[56] References Cited

U.S. PATENT DOCUMENTS

| | | | |
|---|---|---|---|
| 3,922,566 | 11/1975 | Kodama | 377/121 |
| 4,119,867 | 10/1978 | Moritawa et al. | 377/6 |
| 4,855,895 | 8/1989 | Shigaki et al. | 363/157 |
| 4,902,909 | 2/1990 | Chantepie | 377/121 |
| 5,003,566 | 3/1991 | Gabillard et al. | 377/117 |
| 5,163,074 | 11/1992 | Isobe | 377/117 |

FOREIGN PATENT DOCUMENTS

| | | |
|---|---|---|
| 56-007527 | 1/1981 | Japan . |
| 62-176218 | 1/1986 | Japan . |
| 62-202617 | 3/1986 | Japan . |
| 1202923 | 8/1989 | Japan . |
| 1295528 | 11/1989 | Japan . |
| 1303928 | 12/1989 | Japan . |
| 3-195214 | 8/1991 | Japan . |

OTHER PUBLICATIONS

Rocchi et al, "GaAs Digital Dynamic IC's for Applications Up To 10 GHz", IEEE Journal of Solid–State Circuits, vol. SC–18, No. 3, Jun. 1983, pp. 369–376.

Primary Examiner—John S. Heyman
Attorney, Agent, or Firm—Leydig, Voit & Mayer

[57] ABSTRACT

A frequency divider includes a transmission gate having input and output terminals and a gate terminal to which a single-phase clock signal is applied to turn off and off the transmission gate; an element having an input terminal connected to the output terminal of the transmission gate for inversion, delay and amplification of a signal input to the input terminal of the element to produce an output signal and outputting the output signal to the input terminal of the transmission gate; and a frequency divider output terminal connected to the output terminal of the element and to the input terminal of the transmission gate for outputting a signal having a frequency equal to 1/n (n=integer) of the frequency of the clock signal. Since the frequency divider includes one transmission gate and one element, the delay time of the critical path required for inverting the produced frequency-divided signal is reduced so that accurate frequency division is performed with a high-speed clock. Further, accurate frequency division is achieved with a single-phase clock signal.

10 Claims, 12 Drawing Sheets

FREQUENCY DIVIDER

FIELD OF THE INVENTION

The present invention relates to a frequency divider that produces an output signal whose frequency is an exact integral submultiple of the frequency of an input clock signal.

BACKGROUND OF THE INVENTION

A frequency divider is used to reduce the frequency of an input signal.

FIG. 9 is a circuit diagram illustrating a prior art frequency divider.

The frequency divider of FIG. 9 comprises transmission gates T4 and T5 that are turned on or off when a positive phase clock signal and a negative phase clock signal are input to the gate terminals, respectively, an element S3 having function of amplification (hereinafter referred to as an amplification element), and an element S4 having functions of inversion and amplification (hereinafter referred to as an inversion and amplification element).

The amplification element S3 is interposed between an output terminal of the transmission gate T4 and an input terminal of the transmission gate T5. The inversion and amplification element S4 is interposed between an output terminal of the transmission gate T5 and an input terminal of the transmission gate T4.

In this prior art frequency divider, an input terminal of a positive phase clock CLK is connected to the gate terminal of the transmission gate T4, and an input terminal of a negative phase clock $\overline{CLK}$ is connected to the gate terminal of the transmission gate T5. The amplification element S3 is interposed between the output terminal of the transmission gate T4 and the input terminal of the transmission gate T5. The inversion and amplification element S4 is interposed between the output terminal of the transmission gate T5 and the input terminal of the transmission gate T4. An output terminal OUT of the circuit from which a signal obtained by frequency-dividing the positive or negative phase clock signal is output is connected to the output terminal of the element S4. That is, this frequency divider comprises two transmission gates T4 and T5, two input terminals of clock signals having opposite phases, an element S3 having a function of amplification, and an element S4 having functions of inversion and amplification.

FIG. 10 illustrates an example of the frequency divider shown in FIG. 9 in which a noninverting logic circuit is employed as the amplification element S3 and an inverting logic circuit is employed as the inversion and amplification element S4. In FIG. 10, a noninverting logic circuit G5 corresponds to the amplification element S3 of FIG. 9, and an inverting logic circuit G6 corresponds to the inversion and amplification element S4 of FIG. 9. A node N11 corresponds to the input terminal of the transmission gate T4, a node N12 corresponds to the output terminal of the transmission gate T4, a node N13 corresponds to the input terminal of the transmission gate T5, and a node N14 corresponds to the output terminal of the transmission gate T5.

FIG. 15 illustrates a direct coupled FET logic (DCFL) circuit as an example of the inverting logic circuit G6 shown in FIG. 10. In FIG. 15, reference numeral 151 designates an enhancement type FET having a gate connected to an input terminal IN, and numeral 152 designates a diode coupled depletion type FET. These FETs 151 and 152 are connected in series between a power supply $V_{DD}$ and ground GND. The depletion type FET 152 serves as a load for supplying current to the enhancement type FET 151. When a signal is input to the input terminal IN, the input signal is logically inverted and output from the junction of the FETs 151 and 152. These FETs 151 and 152 make an inverting logic circuit corresponding to G6 of FIG. 10. Reference numerals 153 and 154 designate an enhancement type FET and a depletion type FET identical to the enhancement type FET 151 and the depletion type FET 152, respectively. These FETs 153 and 154 make an inverting logic circuit 156 identical to the inverting logic circuit 155. These two inverting logic circuits 155 and 156 make a noninverting logic circuit corresponding to G5 of FIG. 10.

FIG. 11 illustrates a timing chart of the frequency divider shown in FIG. 10. Hereinafter, the operation of the frequency divider will be described using FIG. 11.

The positive phase clock CLK and the negative phase clock $\overline{CLK}$ alternate "High" level and "Low" level (hereinafter referred to as "H" level and "L" level or simply as "H" and "L", respectively) at constant frequency. When the positive phase clock CLK is at "L" level and the node N11 is at "H" level, since the transmission gate T4 is in the OFF state, the signal "H" at the node N11 is not transferred to the node N12.

When the positive phase clock CLK is inverted to "H" level, the transmission gate T4 is turned on, and transfer of the signal "H" at the node N11 toward the node N12 starts. That is, inversion of the node N12 to "H" level is delayed by the delay time of the transmission gate T4 after the inversion of the positive phase clock CLK. The signal "H" at the node N12 is amplified by the noninverting logic circuit G5, and the node N13 is inverted to "H" level after a time interval equivalent to the delay time of the noninverting logic circuit G5. At this time, since the negative phase clock $\overline{CLK}$ is at "L" level, the signal "H" at the node N13 is not transferred to the node N14. When the negative phase clock $\overline{CLK}$ is inverted to "H" level, the transmission gate T5 is turned on, and transfer of the signal "H" at the node N13 toward the node N14 starts.

Inversion of the node N14 to "H" level is delayed by the delay time of the transmission gate T5 after the inversion of the negative phase clock $\overline{CLK}$ to "H" level. Thereafter, the signal "H" at the node N14 is inverted and amplified by the inversion and amplification circuit G6, and the node N11 is inverted to "L" level after a time interval equivalent to the delay time of the inverting logic circuit G6. At this time, since the clock CLK is at "L" level, the signal "L" at the node N11 is not transferred to the node N12. When the positive phase clock CLK is inverted to "H" level, transfer of the signal "L" at the node N11 toward the node N12 starts. In this way, the signal at the node N12 is inverted during one period of the clock.

As described above, the node N11 changes from "H" level to "L" level during one period of the clock CLK, whereby a signal having a frequency equivalent to ½ of the frequency of the clock CLK is produced.

In order to stably operate the prior art frequency divider, the following conditions must be satisfied.

The "H" signal at the node N11 is transferred after the inversion of the clock CLK to "H" level. This "H" signal is inverted to a "L" signal while traveling through the transmission gate T4, the noninverting logic circuit G5, the transmission gate T5, and the inverting logic circuit G6, and the "L" signal returns to the node N11.

At this time, as shown in FIG. 11, if the clock CLK is at "L" level when the node N11 is inverted to "L" level, the frequency of the clock is accurately reduced to ½. However, if the node N11 is not inverted to "L" level by the time the clock CLK is inverted to "H" level because of an increase in the frequency of the clock or increase in the delay time, the clock is not accurately synchronized with the transmission gate T4. As the result, the frequency of the clock is not accurately reduced by ½.

In other words, the total of the delay times of the transmission gate T4, the noninverting logic circuit G5, the transmission gate T5, and the inverting logic circuit G6 must be shorter than one period of the clock CLK.

As the result, in the above-described prior art frequency divider, since the delay time required for inverting the generated frequency-divided signal is too long to achieve accurate frequency division with a high-speed clock. Furthermore, both the positive phase clock signal and the negative phase clock signal are required.

FIG. 12 is a circuit diagram illustrating another frequency divider according to the prior art. This frequency divider includes an amplification element performing differential amplification, whereby highly-reliable operation is achieved compared to the prior art circuit shown in FIG. 9.

The prior art frequency divider shown in FIG. 12 comprises two transmission gates T6 and T7 that are turned on or off when the positive phase clock CLK is input to the gate terminals, two transmission gates T8 and T9 that are turned on or off when the negative phase clock $\overline{CLK}$ is input to the gate terminals, and two amplification elements S5 and S6 each having complementary input and output terminals (hereinafter referred to as complementary input and output amplification elements). The element S5 is interposed between the output terminals of the transmission gates T6 and T7 and the input terminals of the transmission gates T8 and T9. The element S6 is interposed between the output terminals of the transmission gates T6 and T7 and the input terminals of the transmission gates T6 and T7. The complementary output terminals of the element S6 are cross-connected to the input terminals of the transmission gates T6 and T7.

In this frequency divider, the input terminal of the positive phase clock CLK is connected to the gate terminals of the transmission gates T6 and T7. The input terminal of the negative phase clock $\overline{CLK}$ is connected to the gate terminals of the transmission gates T8 and T9. The complementary input and output amplification element S5 is interposed between the output terminals of the transmission gates T6 and T7 and the input terminals of the transmission gates T8 and T9. The complementary input and output amplification element S6 is interposed between the output terminals of the transmission gates and the input terminals of the transmission gates T6 and T7. The complementary output terminals of the element S6 are cross-connected to the input terminals of the transmission gates T6 and T7. Two output terminals OUT and $\overline{OUT}$ from which positive and negative phase signals obtained by frequency-dividing the positive and negative phase clock signals CLK And $\overline{CLK}$ are respectively output are connected to the complementary output terminals of the element S6. That is, this frequency divider comprises four transmission gates T6, T7, T8, and T9, two input terminals from which opposite phase clock signals CLK and $\overline{CLK}$ are applied to the transmission gates T6 and T7 and the transmission gates T8 and T9, respectively, and two complementary input and output amplification elements S5 and S6.

FIG. 13 is a circuit diagram illustrating an example of the frequency divider of FIG. 12 in which complementary input and output noninverting logic circuits are employed as the complementary input and output amplification elements S5 and S6.

In FIG. 13, a complementary input and output noninverting logic circuit G7 corresponds to the complementary input and output amplification element S5 of FIG. 12, and a complementary input and output noninverting logic circuit G8 corresponds to the inversion and amplification element S6 of FIG. 12.

A noninverting input terminal and a noninverting output terminal of the noninverting logic circuit G7 are connected to an output terminal of the transmission gate T6 and an input terminal of the transmission gate T8, respectively. An inverting input terminal and an inverting output terminal of the circuit G7 are connected to an output terminal of the transmission gate T7 and an input terminal of the transmission gate T9, respectively.

A noninverting input terminal and a noninverting output terminal of the noninverting logic circuit G8 are connected to an output terminal of the transmission gate T8 and an input terminal of the transmission gate T7, and an inverting input terminal and an inverting output terminal of the circuit G8 are connected to an output terminal of the transmission gate T9 and an input terminal of the transmission gate T6, respectively.

In FIG. 13, nodes N31 and N35 correspond to the input terminals of the transmission gates T6 and T7, respectively. Nodes N32 and N36 correspond to the output terminals of the transmission gates T6 and T7, respectively. Nodes N33 and N37 correspond to the input terminals of the transmission gates T8 and T9, respectively. Nodes N34 and N38 correspond to the output terminals of the transmission gates T8 and T9, respectively.

FIG. 16 illustrates a source coupled FET logic (SCFL) circuit as an example of the noninverting amplification circuit of FIG. 12.

In FIG. 16, reference numerals 161 and 162 designate enhancement type FETs having gates to which a positive phase input terminal IN and a negative phase input terminal $\overline{IN}$ are connected, respectively. Reference numeral 163 designates a current source interposed between a common source of these FETs and a power supply $V_{SS}$. A diode coupled depletion type FET 172 is employed as the current source 163. Alternatively, a resistor 173 may be interposed between the source of the FET 172 and the power supply $V_{SS}$. Reference numerals 164 and 165 designate resistors interposed between ground GND and drains of the FETs 161 and 162, respectively. Reference numerals 166 and 167 designate enhancement type FETs having drains connected to the ground GND and gates connected to the drains of the FETs 161 and 162, respectively. Reference numerals 168 and 169 designate diodes having anodes connected to the sources of the FETs 166 and 167, respectively. Reference numerals 170 and 171 designate current sources interposed between the power supply $V_{SS}$ and cathodes of the diodes 168 and 169, respectively. The junction of the cathode of the diode 168 and the current source 170 is connected to the negative phase output terminal $\overline{OUT}$, and the junction of the cathode of the diode 169 and the current source 171 is connected to a positive phase output terminal OUT.

In the circuit shown in FIG. 16, signals having opposite phases respectively input to the input terminals IN and $\overline{IN}$ are subjected to differential amplification in the FETs 161 and 162, respectively, and signals having phases opposite to the signals at the input terminals IN and $\overline{IN}$ appear at the drains of the FETs 161 and 162, respectively. These signals are transferred through the source follower FETs 166 and 167 and appear at the output terminals OUT and $\overline{\text{OUT}}$, respectively, so that amplified signals having the same phases as the signals at the input terminals IN and $\overline{\text{IN}}$ are output from the output terminals OUT and $\overline{\text{OUT}}$, respectively.

FIG. 14 is a timing chart of the frequency divider shown in FIG. 13. Hereinafter, the operation of the frequency divider will be described using FIG. 14.

Also in this frequency divider, the same conditions as described with respect to the frequency divider according to the first prior art must be satisfied to achieve a desired frequency dividing operation.

More specifically, the positive phase clock CLK and the negative phase clock $\overline{\text{CLK}}$ alternate "H" level and "L" level at constant frequency. When the positive phase clock CLK is at "L" level and the nodes N31 and N35 are at "H" level and "L" level, respectively, both of the transmission gates T6 and T7 are in OFF state, so that signals "H" and "L" at the nodes N31 and N35 are not transferred to the nodes N32 and N36.

When the positive phase clock CLK is inverted to "H" level, the transmission gates T6 and T7 are turned on, and transfer of the signals "H" and "L" at the nodes N31 and N35 toward the nodes N32 and N36 starts. That is, after the inversion of the positive phase clock CLK to "H" level, inversion of the node N32 (N36) to "H" level ("L" level) is delayed by the delay time of the transmission gate T6 (T7). The signals "H" and "L" at the nodes N32 and N36 are subjected to differential amplification in the noninverting logic circuit G7, and the nodes N33 and N37 are inverted to "H" and "L" levels, respectively, after a time interval equivalent to the delay time of the noninverting logic circuit G7. At this time, since the negative phase clock $\overline{\text{CLK}}$ is at "L" level, the signals "H" and "L" at the nodes N33 and N37 are not transferred to the nodes N34 and N38, respectively.

When the negative phase clock $\overline{\text{CLK}}$ is inverted to "H" level, the transmission gates T8 and T9 are turned on, and transfer of the signals "H" and "L" at the nodes N33 and N37 toward the nodes N34 and N38, respectively, starts.

More specifically, after the inversion of the negative clock $\overline{\text{CLK}}$ to "H" level, the nodes N34 and N38 are inverted to "H" and "L" levels after a time interval equivalent to the delay time of the transmission gates T8 and T9, respectively. The signals "H" and "L" at the nodes N34 and N38 are amplified without being inverted by the noninverting logic circuit G8. Since the outputs of the noninverting logic circuit G8 are cross-connected to the nodes N31 and N35, the nodes N31 and N35 are inverted to "L" and "H" levels, respectively, after a time interval equivalent to the delay time of the noninverting logic circuit G8. At this time, since the clock CLK is at "L" level, the signals "L" and "H" at the nodes N31 and N35 are not transferred to the nodes N32 and N36, respectively.

When the positive phase clock CLK is inverted to "H" level, transfer of the signals "L" and "H" at the nodes N31 and N35 toward the nodes N32 and N36, respectively, starts. In this way, the signals at the nodes N32 and N36 are inverted during one period of the clock.

As described above, the nodes N31 and N35 change from "H" level to "L" level during one period of the clock CLK, and a signal having a frequency equivalent to ½ of the frequency of the clock CLK is produced.

In order to accurately operate this prior art frequency divider, the following conditions must be satisfied.

Transfer of the signal "H" at the node N31 starts after the inversion of the clock CLK to "H" level. This signal "H" travels through the transmission gate T6, the noninverting logic circuit G7, the transmission gate T8, and the noninverting logic circuit G8 and returns to the node N35. On the other hand, transfer of the signal "L" at the node N35 starts after the inversion of the clock CLK to "H" level. This signal "L" travels through the transmission gate T7, the noninverting logic circuit G7, the transmission gate T9, and the noninverting logic circuit G8 and returns to the node N31.

As shown in FIG. 14, if the clock CLK is at "L" level when the node N31 is inverted to "L" level, the frequency of the clock is accurately reduced to ½. However, if the node N31 has not been inverted to "L" level by the time the clock CLK is inverted to "H" level because of an increase in the frequency of an the clock or increase in the delay time, the clock is not accurately synchronized in the transmission gate T4 and the frequency of the clock is not accurately reduced by ½.

In other words, each of the total of the delay times of the transmission gate T6, the complementary input and output noninverting logic circuit G7, the transmission gate T8, and the complementary input and output noninverting logic circuit G8 and the total of the delay times of the transmission gate T7, the complementary input and output noninverting logic circuit G7, the transmission gate T9, and the complementary input and output noninverting logic circuit G8 must be shorter than the period of the clock CLK.

As described above, also in this second frequency divider according to the prior art, the delay time required for inverting the frequency-divided signal is too long to achieve accurate frequency division with a high-speed clock. In addition, both the positive phase clock and the negative phase clock are needed.

SUMMARY OF THE INVENTION

It is an object of the present invention to provide a frequency divider that reduces the delay time required for inverting the produced frequency-divided signal, that performs accurate frequency division with a high-speed clock, and that performs accurate frequency division with only a positive phase clock signal.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a frequency divider includes a transmission gate having input and output terminals and a gate terminal, that is turned on or off by a single-phase clock signal input to the gate terminal; an element having an input terminal connected to the output terminal of the transmission gate and performing inversion, delay, and amplification of a signal input to the input terminal and outputting the signal to the input terminal of the transmission gate; and an output terminal connected to the output terminal of the element having functions of inversion, delay, and amplification and to the input terminal of the transmission gate, and outputting a signal having a frequency equal to 1/n (n=integer) of the frequency of the clock signal. Since the frequency divider comprises one transmission gate and one inversion and amplification element, the delay time of the critical path required for inverting the produced frequency-divided signal is reduced, so that accurate frequency division is performed with a high-speed clock. Further, accurate frequency division is achieved with a single-phase clock signal.

According to a second aspect of the present invention, in the above-described frequency divider, the total of the delay times of the transmission gate and the element having functions of inversion, delay, and amplification is shorter than one period of the clock and longer than a time interval of a first logic level within one period of the clock. Therefore, the above-described frequency divider performs accurate frequency division.

According to a third aspect of the present invention, in the above-described frequency divider, an inverting logic circuit is used as the element having functions of inversion, delay, and amplification. Therefore, the size of the circuit having functions of inversion, delay, and amplification can be reduced.

According to a fourth aspect of the present invention, a frequency divider comprises a first transmission gate having input and output terminals and a gate terminal which is turned on or off by a single-phase clock signal input to the gate terminal; a first element having an input terminal connected to the output terminal of the first transmission gate and performing delay and amplification of a signal input to the input terminal; a second transmission gate having input and output terminals and a gate terminal, said input terminal being connected to an output terminal of the first element, which is turned on or off when a clock signal having the same phase as the clock signal applied to the first transmission gate is applied to the gate terminal; a second element having an input terminal connected to the output terminal of the second transmission gate, and performing inversion, delay, and amplification of a signal input to the input signal; and an output terminal connected to an output terminal of the second element and to the input terminal of the first transmission gate and outputting a signal having a frequency equal to 1/n (n=integer) of the frequency of the clock signal. Therefore, by adding a few elements, the frequency dividing ratio is increased according to the number of the added circuits.

According to a fifth aspect of the present invention, in the above-described frequency divider, the total of delay times of the first transmission gate and the first element having functions of delay and amplification and the total of delay times of the second transmission gate and the second element having functions of inversion, delay and amplification are shorter than one period of the clock and longer than a time interval of a first logic level within one period of the clock. Therefore, the above-described frequency divider performs an accurate frequency dividing operation.

According to a sixth aspect of the present invention, in the above-described frequency divider, a noninverting logic circuit is used as the first element having functions of delay and amplification, and an inverting logic circuit is used as the element having functions of inversion, delay, and amplification. Therefore, the size of the circuit having functions of delay and amplification can be reduced.

According to a seventh aspect of the present invention, a frequency divider comprises first and second transmission gates, each transmission gate having input and output terminals and a gate terminal, which are turned on or off by single-phase clock signals of the same phase applied to the gate terminals; an element having complementary input terminals connected to the output terminals of the first and second transmission gates and complementary output terminals cross-connected to the input terminals of the first and second transmission gates, and performing delay and amplification of signals input to the complementary input terminals; and first and second output terminals connected to the complementary output terminals of the element having functions of delay and amplification, and outputting signals of opposite phases each having a frequency equal to 1/n (n=integer) of the frequency of the clock signal. Therefore, the frequency divider is realized using few elements, and the delay time of the critical path required for inverting the produced frequency-divided signal is reduced. As the result, accurate frequency division is performed with a high-speed clock. Further, accurate frequency division is achieved with a single-phase clock signal.

According to an eighth aspect of the present invention, in the above-described frequency divider, the total of the delay times of the first transmission gate and the element having functions of delay and amplification and the total of the delay times of the second transmission gate and the element having functions of delay and amplification are shorter than one period of the clock and longer than a time interval of a first logic level within one period of the clock. Therefore, the above-described frequency divider performs accurate frequency division.

According to a ninth aspect of the present invention, in the above-described frequency divider, a noninverting logic circuit having complementary input and output terminals is used as the element having functions of delay and amplification. Therefore, the size of the circuit having functions of delay and amplification can be reduced.

According to a tenth aspect of the present invention, the above-described frequency divider includes first and second two-input NOR logic circuits, each logic circuit having two input terminals and an output terminal, as the element having functions of delay and amplification. The first input terminal of the first two-input NOR logic circuit is connected to the output terminal of the first transmission gate, the second input terminal of the first two-input NOR logic circuit is connected to the output terminal of the second two-input NOR logic circuit, the first input terminal of the second two-input NOR logic circuit is connected to the output terminal of the second transmission gate, the second input terminal of the second two-input NOR logic circuit is connected to the output terminal of the first two-input NOR logic circuit, the output terminal of the first two-input NOR logic circuit is connected to the input terminal of the first transmission gate, and the output terminal of the second two-input NOR logic circuit is connected to the input terminal of the second transmission gate. Therefore, stable frequency dividing operation is achieved regardless of leakage from the transmission gate.

According to an eleventh aspect of the present invention, the above-described frequency divider includes first and second two-input NAND logic circuits, each logic circuit having two input terminals and an output terminal, as the element having functions of delay and amplification. The first input terminal of the first two-input NAND logic circuit is connected to the output terminal of the first transmission gate, the second input terminal of the first two-input NAND logic circuit is connected to the output terminal of the second two-input NAND logic circuit, the first input terminal of the second two-input NAND logic circuit is connected to the output terminal of the second transmission gate, the second input terminal of the second two-input NAND logic circuit is connected to the output terminal of the first two-input NAND logic circuit, the output terminal of the first two-input NAND logic circuit is connected to the input terminal of the first transmission gate, and the output terminal of the second two-input NAND logic circuit is connected to the input terminal of the second transmission gate. Therefore, stable frequency dividing operation is achieved regardless of leakage from the transmission gate.

According to a twelfth aspect of the present invention, a frequency divider comprises first and second transmission gates, each transmission gate having input and output terminals and a gate terminal, which are turned on or off by single-phase clock signals of the same phase applied to the gate terminals; a first element having complementary input terminals connected to the output terminals of the first and second transmission gates and complementary output terminals, and performing delay and amplification of signals input to the complementary input terminals; third and fourth transmission gates, each transmission gate having input and output terminals and a gate terminal, the input terminals of these transmission gates being connected to the complementary output terminals of the first element having functions of delay and amplification, which are turned on or off when input clock signals having the same phase as the clock signals applied to the first and second transmission gates are applied to the gate terminals; a second element having complementary input terminals connected to the output terminals of the third and fourth transmission gates and complementary output terminals cross-connected to the input terminals of the first and second transmission gates, and performing delay and amplification of signals input to the complementary input terminals; and first and second output terminals connected to the complementary output terminals of the second element having functions of delay and amplification, and outputting signals of opposite phases each having a frequency equal to 1/n (n=integer) of the frequency of the clock signal. Therefore, by adding a few elements, the frequency dividing ratio can be increased according to the number of the added circuits.

According to a thirteenth aspect of the present invention, in the above-described frequency divider, the total of the delay times of the first transmission gate and the first element having functions of delay and amplification, the total of the delay times of the second transmission gate and the first element having functions of delay and amplification, the total of the delay times of the third transmission gate and the second element having functions of delay and amplification, and the total of delay times of the fourth transmission gate and the second element having functions of delay and amplification are shorter than one period of the clock and longer than a time interval of a first logic level within one period of the clock. Therefore, the above-described frequency divider performs an accurate frequency dividing operation.

According to a fourteenth aspect of the present invention, in the above-described frequency divider, a noninverting logic circuit having complementary input and output terminals is used as the first and second elements having functions of delay and amplification. Therefore, the size of the circuit having functions of delay and amplification can be reduced.

According to a fifteenth aspect of the present invention, the above-described frequency divider includes first and second two-input NOR logic circuits, each logic circuit having two input terminals and an output terminal, as the second element having functions of delay and amplification. The first input terminal of the first two-input NOR logic circuit is connected to the output terminal of the first transmission gate, the second input terminal of the first two-input NOR logic circuit is connected to the output terminal of the second two-input NOR logic circuit, the first input terminal of the second two-input NOR logic circuit is connected to the output terminal of the second transmission gate, the second input terminal of the second two-input NOR logic circuit is connected to the output terminal of the first two-input NOR logic circuit, the output terminal of the first two-input NOR logic circuit is connected to the input terminal of the first transmission gate, and the output terminal of the second two-input NOR logic circuit is connected to the input terminal of the second transmission gate. Therefore, stable frequency dividing operation is achieved regardless of leakage from the transmission gate.

According to a sixteenth aspect of the present invention, the above-described frequency divider includes first and second two-input NAND logic circuits, each logic circuit having two input terminals and an output terminal, as the second element having functions of delay and amplification. The first input terminal of the first two-input NAND logic circuit is connected to the output terminal of the first transmission gate, the second input terminal of the first two-input NAND logic circuit is connected to the output terminal of the second two-input NAND logic circuit, the first input terminal of the second two-input NAND logic circuit is connected to the output terminal of the second transmission gate, the second input terminal of the second two-input NAND logic circuit is connected to the output terminal of the first two-input NAND logic circuit, the output terminal of the first two-input NAND logic circuit is connected to the input terminal of the first transmission gate, and the output terminal of the second two-input NAND logic circuit is connected to the input terminal of the second transmission gate. Therefore, stable frequency dividing operation is achieved regardless of leakage from the transmission gate.

DETAILED DESCRIPTION OF THE PREFERRED EMBODIMENTS

Figure 1:
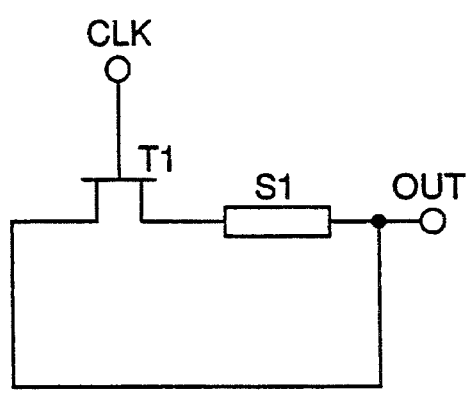
FIG. 1 is a circuit diagram illustrating a frequency divider in accordance with a first embodiment of the present invention.

FIG. 1 is a circuit diagram illustrating a frequency divider in accordance with a first embodiment of the present invention. The frequency divider of this first embodiment is a further developed version of the prior art frequency divider shown in FIG. 9. That is, the frequency divider shown in FIG. 1 reduces the delay time required for inversion of the frequency-divided signal in the circuit, whereby high-speed frequency division is realized.

In FIG. 1, the frequency divider includes a transmission gate T1 that is turned on or off when a clock signal CLK is input to a gate terminal and an element S1 having functions of inversion, delay, and amplification of an input signal (hereinafter referred to as inversion . delay amplification element).

An input terminal of the clock CLK is connected to the gate terminal of the transmission gate T1. An output terminal of the transmission gate T1 is connected to an input terminal of the inversion delay amplification element S1. An input terminal of the transmission gate T1 is connected to an output terminal of the element S1. The output terminal of the element S1 is connected to an output terminal OUT from which a signal obtained by frequency-dividing the clock signal is output. That is, this frequency divider comprises a transmission gate having an input terminal for a single phase clock signal, and an element having functions of inversion, delay, and amplification.

Figure 2:
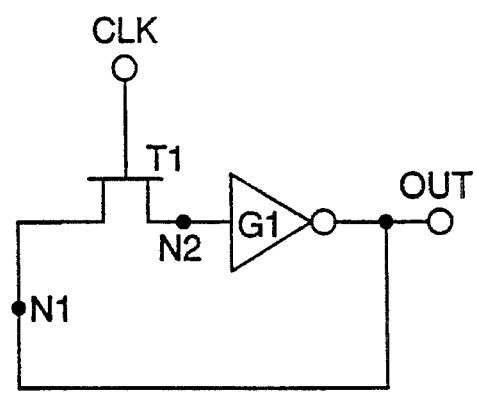
FIG. 2 is a circuit diagram illustrating the frequency divider of FIG. 1 including an inverting logic circuit.

FIG. 2 is a circuit diagram illustrating an example of the frequency divider of FIG. 1 in which an inverting logic circuit is employed as the inversion.delay.amplification element S1.

In FIG. 2, an inverting logic circuit G1 corresponds to the element S1 of FIG. 1. In addition, nodes N1 and N2 correspond to the input terminal and the output terminal of the transmission gate T1, respectively.

Figure 15:
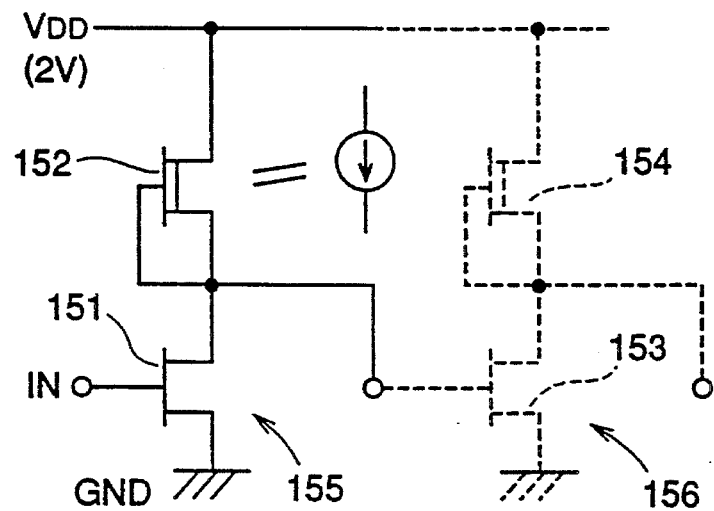
FIG. 15 is a circuit diagram illustrating an inverting logic circuit employing a DCFL circuit.

A DCFL (Direct Coupled FET Logic) circuit shown in FIG. 15 may be employed as the inverting logic circuit shown in FIG. 2.

Figure 3:
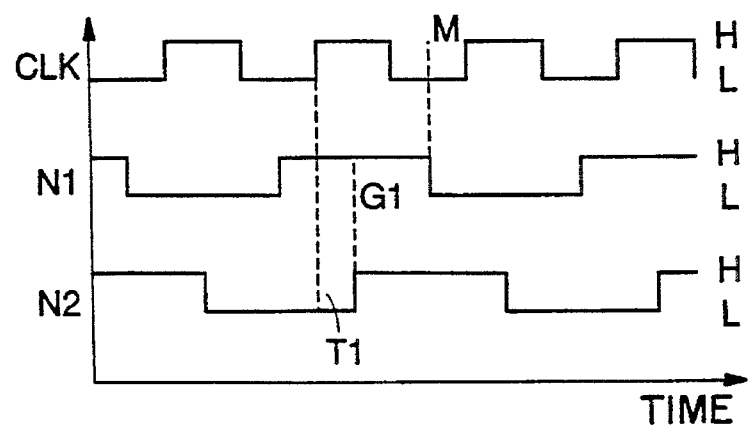
FIG. 3 is a timing chart of the frequency divider of FIG. 2.

FIG. 3 is a timing chart of the frequency divider shown in FIG. 2. Hereinafter, the operation of the frequency divider will be described with reference to FIG. 3.

The single phase (positive phase) clock CLK alternates between "H" level and "L" level at constant frequency. When the clock CLK is at "L" level and the node N1 is at "H" level, the transmission gate T1 is in the OFF state, so that the signal "H" at the node N1 is not transferred to the node N2. When the clock CLK is inverted to "H" level, the transmission gate T1 is turned on, and transfer of the signal "H" at the node N1 toward the node N2 starts. That is, inversion of the node N2 to "H" level is delayed by the delay time of the transmission gate T1 after the inversion of the positive clock CLK to "H" level. The signal "H" at the node N2 is inverted and amplified through the inverting logic circuit G1, and the node N1 is turned to "L" level after a time interval equivalent to the delay time of the inverting logic circuit G1. At this time, if the clock CLK is at "L" level, the signal "L" at the node N1 is not transferred to the node N2. When the clock CLK is inverted to "H" level, transfer of the signal "L" at the node N1 toward the node N2 starts. In this way, the signal at the node N1 is inverted during one period of the clock CLK.

As described above, the node N11 is changed from "H" level to "L" level during one period of the clock CLK, and a signal having a frequency equivalent to ½ of the frequency of the clock CLK is produced.

In order to accurately operate the frequency divider of this first embodiment, the following conditions must be satisfied.

That is, for the reason as described with respect to the prior art, the total of the delay times of the transmission gate T1 and the inverting logic circuit G1 must be shorter than the period of the clock CLK. This is the first condition.

The second condition described in the following is peculiar to this first embodiment of the invention. After the inversion of the clock CLK to "H", the signal "H" at the node N1 is inverted to the frequency-divided signal "L" and returns to the node N1 after a time interval equivalent to the delay times of the transmission gate T1 and the inverting logic circuit G1. At this time, if the clock CLK is not at "L" level, the frequency-divided signal is not accurately produced.

Assuming that the duty ratio is 1, i.e., the time interval during which the clock CLK is "H" is equal to the time interval during which the clock CLK is "L", the time interval during which the clock CLK is "H" is equal to ½ of the period of the clock. Therefore, the total of the delay times of the transmission gate T1 and the inverting logic circuit G1 must be longer than ½ of the clock period. Further, when the duty ratio is small, i.e., when the time interval during which the clock CLK is "H" is shorter than the time interval during which the clock CLK is "L", accurate frequency division is achieved even when the total of the delay times of the transmission gate T1 and the inverting logic circuit G1 is shorter than ½ of the clock period.

As the result, if the duty ratio of the clock CLK is 1, the total of the delay times of the transmission gate T1 and the inverting logic circuit G1 must be shorter than the clock period and longer than ½ of the clock period.

The upper limit of the operating frequency of the frequency divider is determined by the above-described condition that the total of the delay times of the transmission gate T1 and the inverting logic circuit G1 should be shorter than the clock period, and the lower limit of the operating frequency of this circuit is determined by the condition that the total of the delay times should be longer than ½ of the clock period. Therefore, assuming that the total delay time is 100 psec., the upper limit of the operating frequency is $1/(100\times10^{-12})=10$ GHz, and the lower limit is one-half of 10 GHz, i.e., 5 GHz.

Figure 9:
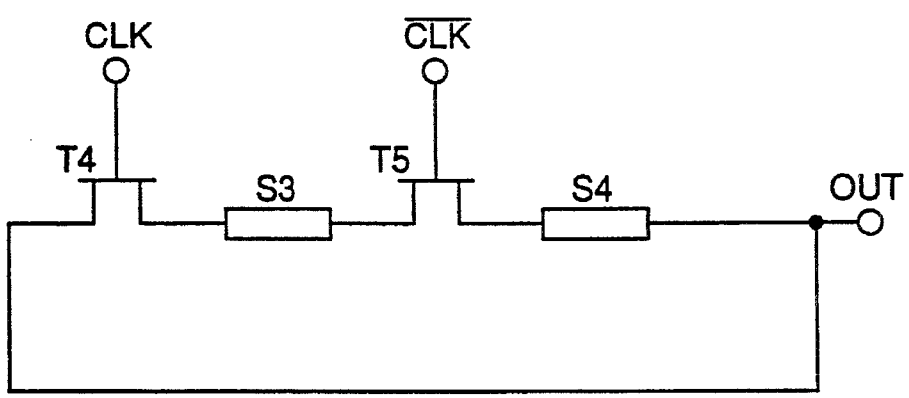
FIG. 9 is a circuit diagram illustrating a frequency divider according to the prior art.
Figure 10:
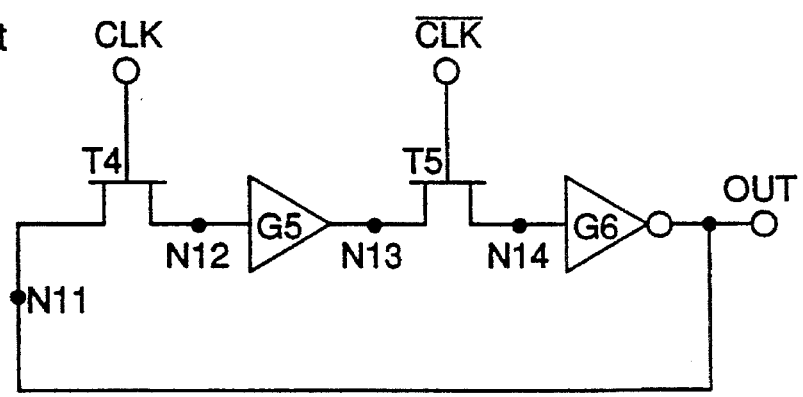
FIG. 10 is a circuit diagram illustrating the frequency divider of FIG. 9 including a noninverting logic circuit and an inverting logic circuit.
Figure 11:
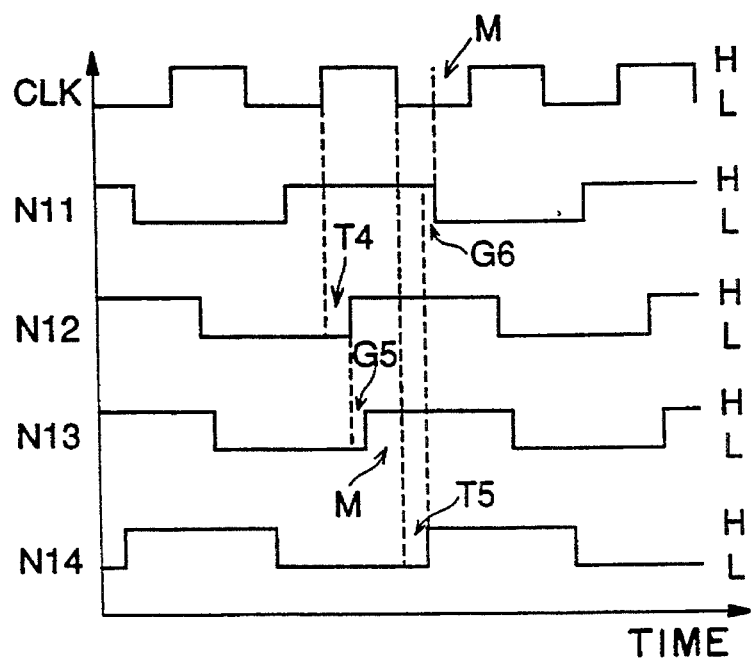
FIG. 11 is a timing chart of the frequency divider of FIG. 10.

A description is given of comparison between the frequency divider of this first embodiment and the prior art circuit shown in FIG. 9. In the prior art frequency divider, the total of the delay times of two transmission gates and two logic circuits should be shorter than the clock period. On the other hand, in the frequency divider of this embodiment, the total of the delay times of one transmission gate and one logic circuit should be shorter than the clock period. Assuming that both of these frequency dividers include the same transmission gates and the same logic circuits, the frequency divider of this first embodiment performs accurate frequency division with a clock of shorter period (about ½ period) than the clock employed in the prior art circuit. In other words, accurate frequency division is realized with a higher clock frequency. Further, since the negative phase clock signal can be dispensed with in the frequency divider of this first embodiment, the generation of the clock signal is facilitated. Furthermore, number of the constituent elements is significantly decreased compared to the prior art circuit.

While in the above-described first embodiment of the invention a DCFL circuit is employed as the inverting logic circuit, a CMOS (Complementary Metal Oxide Semiconductor) inverter including an ordinary transistor may be employed.

Figure 4:
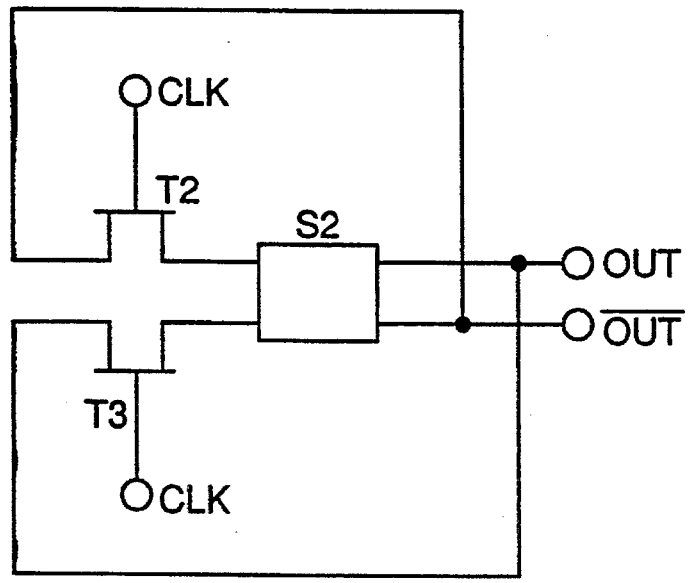
FIG. 4 is a circuit diagram illustrating a frequency divider in accordance with a second embodiment of the present invention.
Figure 12:
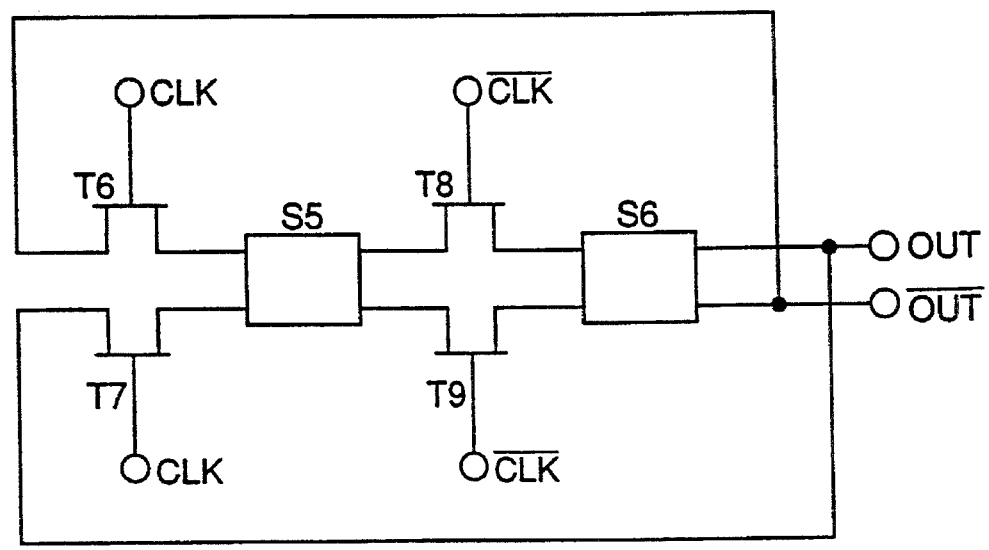
FIG. 12 is a circuit diagram illustrating a frequency divider according to the prior art.
Figure 13:
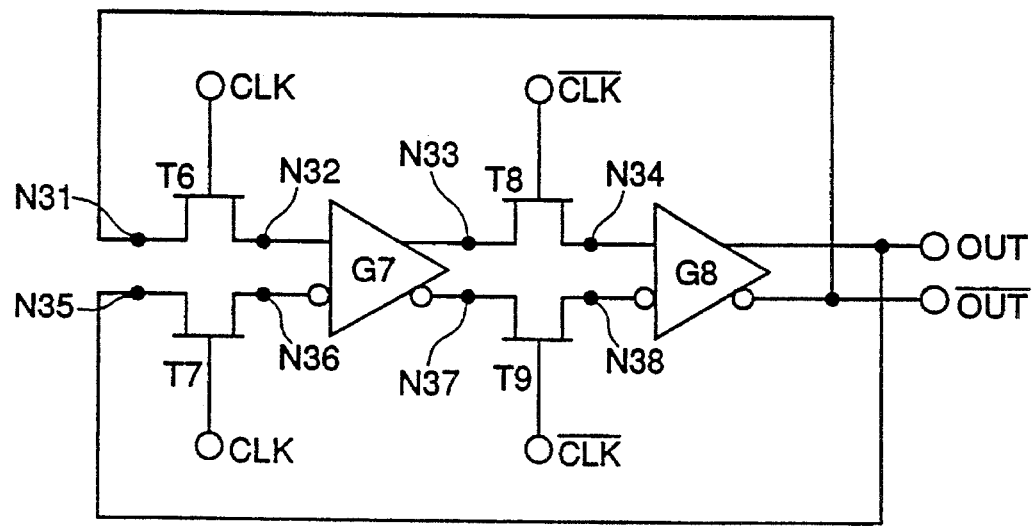
FIG. 13 is a circuit diagram illustrating the frequency divider of FIG. 12 including a complementary input and output noninverting logic circuit.
Figure 14:
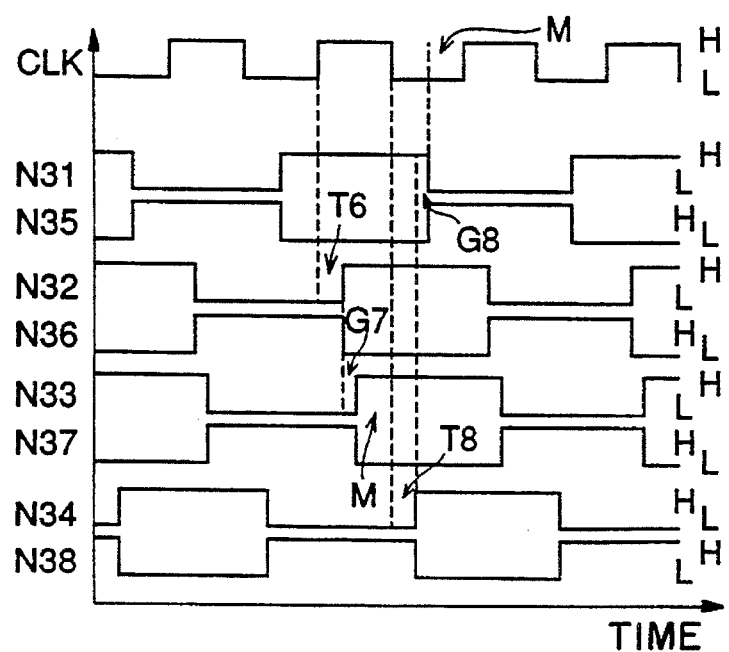
FIG. 14 is a timing chart of the frequency divider of FIG. 13.

FIG. 4 is a circuit diagram illustrating a frequency divider in accordance with a second embodiment of the present invention. The frequency divider of this second embodiment is a further developed version of the prior art frequency divider shown in FIG. 12. That is, the frequency divider shown in FIG. 4 reduces the delay time required for inverting the frequency-divided signal in the circuit, whereby high-speed frequency division is realized.

In FIG. 4, the frequency divider of this second embodiment includes two transmission gates T2 and T3 that are turned on or off when clock signals CLK of the same phase are input to the gate terminals and an element S2 including complementary input and output terminals and having functions of delay and amplification (hereinafter referred to as complementary input-output delay and amplification element).

Two input terminals of the clock CLK are respectively connected to the gate terminals of the transmission gates T2 and T3. The output terminals of the transmission gates T2 and T3 are respectively connected to the complementary input terminals of the delay and amplification element S2. The complementary output terminals of the delay and amplification element S2 are cross-connected to the input terminals of the transmission gates T2 and T3. That is, this frequency divider comprises two transmission gates, two input terminals for supplying clock signals to these transmission gates, and one complementary input-output delay and amplification element.

Figure 5:
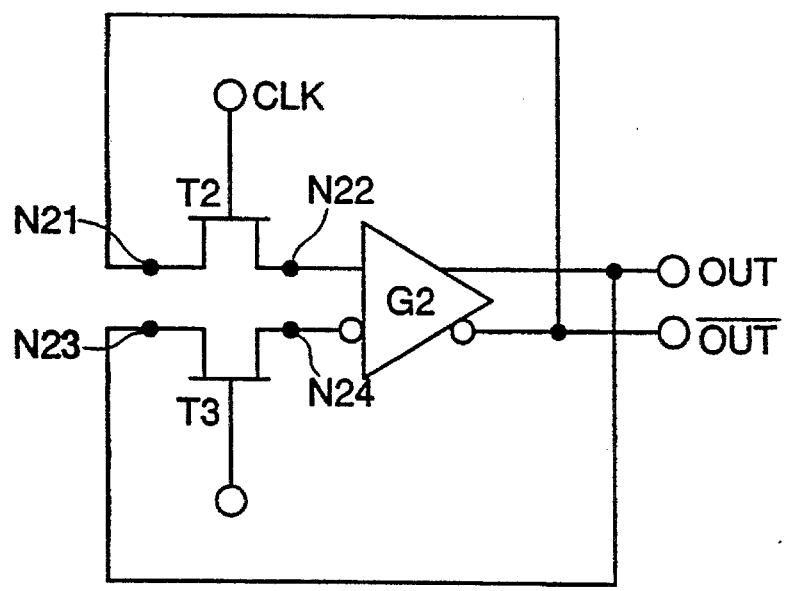
FIG. 5 is a circuit diagram illustrating the frequency divider of FIG. 4 including a complementary input-output noninverting logic circuit.

FIG. 5 illustrates an example of the frequency divider of FIG. 4 in which a noninverting logic circuit G2 having complementary input and output terminals is employed as the delay and amplification element S2.

In FIG. 5, nodes N21 and N23 correspond to the input terminals of the transmission gates T2 and T3, respectively, and nodes N22 and N24 correspond to the output terminals of the transmission gates T2 and T3, respectively.

Figure 16:
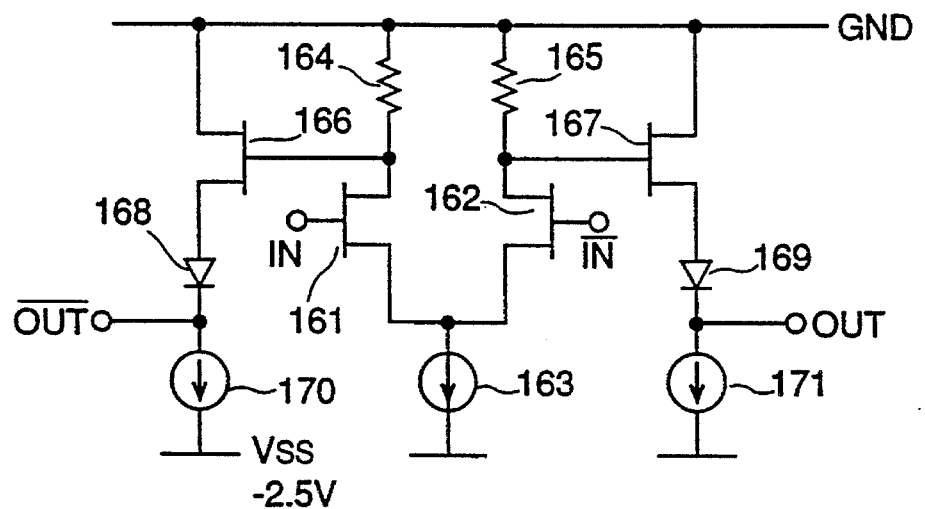
FIG. 16 is a circuit diagram illustrating a complementary input and output noninverting logic circuit employing a SCFL circuit.
Figure 16:
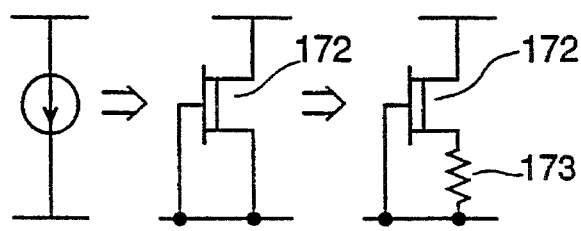

A source coupled FET logic (SCFL) circuit shown in FIG. 16 may be employed as the noninverting logic circuit of FIG. 5.

Figure 6:
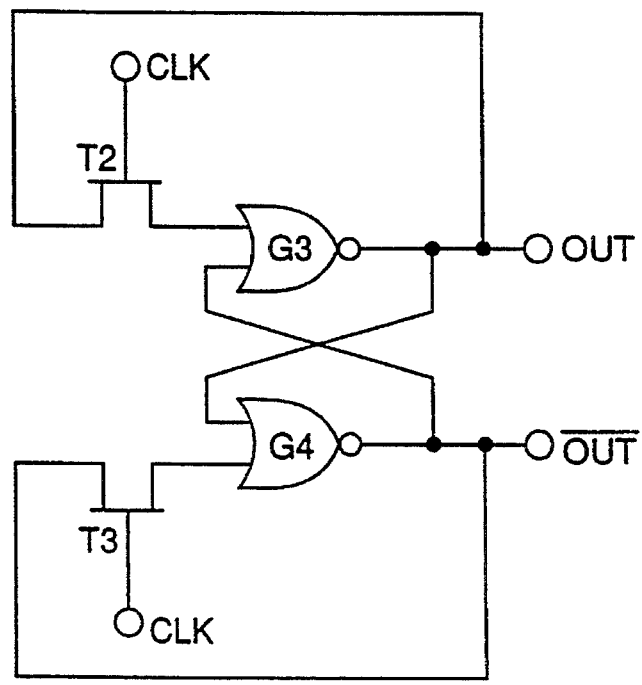
FIG. 6 is a circuit diagram illustrating the frequency divider of FIG. 4 including two two-input NOR logic circuits.

FIG. 6 illustrates another example of the frequency divider of FIG. 4 in which a latch circuit comprising two two-input NOR logic circuit G3 and G4 is employed as the complementary input-output delay and amplification element S2.

In FIG. 6, first input terminals of the respective two-input NOR logic circuits G3 and G4 are respectively connected to output terminals of the transmission gates T2 and T3, and the output terminals of the two-input NOR logic circuits G3 and G4 are cross-connected to second input terminals of the two-input NOR logic circuits G4 and G3, respectively. Further, the output terminals of the two-input NOR logic circuits G3 and G4 are connected to a positive phase output terminal OUT and a negative phase output terminal $\overline{\text{OUT}}$, respectively, and to the input terminals of the transmission gates T2 and T3, respectively.

Figure 17:
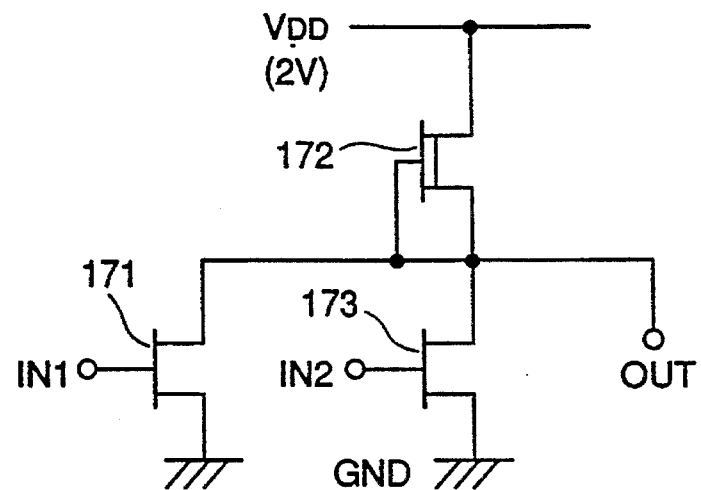
FIG. 17 is a circuit diagram illustrating a two-input NOR logic circuit employing a DCFL circuit.

FIG. 17 is a circuit diagram illustrating an example of the two-input NOR logic circuit shown in FIG. 6. In FIG. 17, a DCFL circuit is employed as the NOR logic circuit.

In FIG. 17, reference numerals 171 and 173 designate enhancement type FETs including gates to which input signals IN1 and IN2 are applied, respectively, and sources connected to ground GND. Reference numeral 172 designates a diode coupled depletion type FET having a drain connected to a power supply $V_{DD}$ and a source connected to drains of the FETS 171 and 173. The FET 172 serves as a load for supplying current to the FETs 171 and 173. When a signal "H" signal is input to one of the input terminals IN1 and IN2, a signal "L" is output from the OUT that is connected to the junction of the drains of the FETs 171 and 173 and the source of the FET 172.

Figure 7:
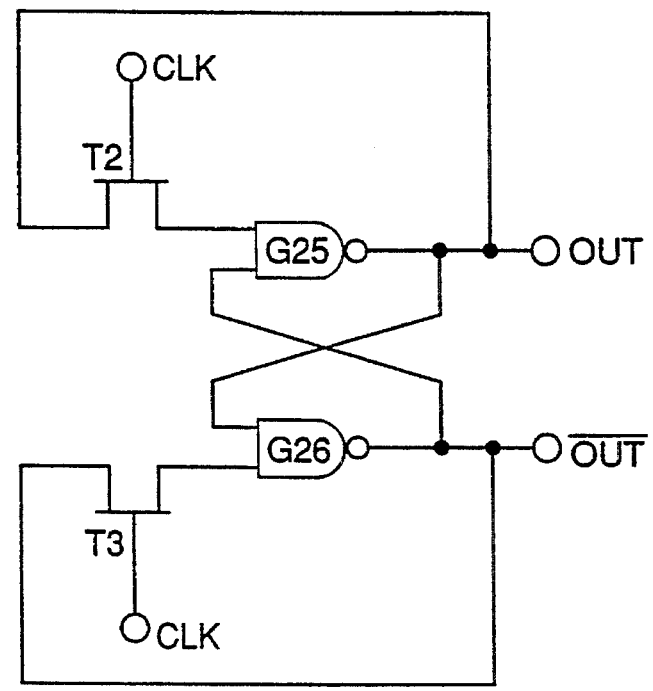
FIG. 7 is a circuit diagram illustrating the frequency divider of FIG. 4 including two two-input NAND logic circuits.

FIG. 7 is a circuit diagram illustrating an example of the frequency divider shown in FIG. 4 in which a latch circuit comprising two two-input NAND logic circuits is employed as the delay and amplification element S2.

In FIG. 7, first input terminals of the respective two-input NAND logic circuits G25 and G26 are connected to output terminals of the transmission gates T2 and T3, and the output terminals of the two-input NAND logic circuits G25 and G26 are cross-connected to second input terminals of the two-input NAND logic circuits G26 and G25, respectively. Further, the output terminals of the two-input NAND logic circuits G25 and G26 are connected to positive and negative phase output terminals OUT and $\overline{\text{OUT}}$, respectively, and to the input terminals of the transmission gates T2 and T3, respectively.

Figure 18:
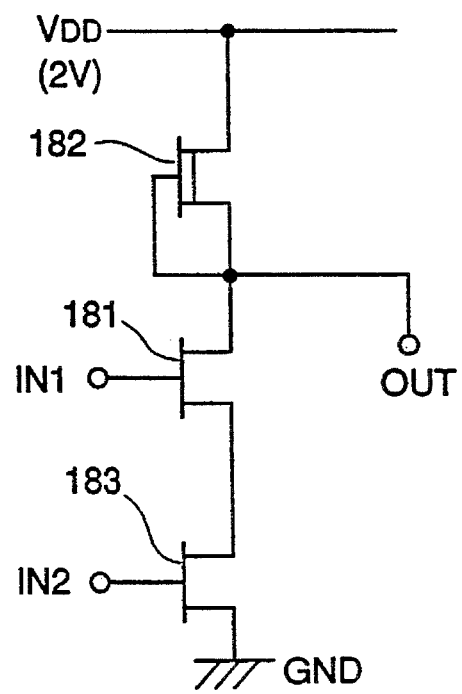
FIG. 18 is a circuit diagram illustrating a two-input NAND logic circuit employing a DCFL circuit.

FIG. 18 is a circuit diagram illustrating an example of the two-input NAND logic circuit shown in FIG. 7. In FIG. 18, a DCFL circuit is employed as the NAND logic circuit.

In FIG. 18, reference numerals 181 and 183 designate enhancement type FETs which are connected in series. Input signals IN1 and IN2 are applied to gates of the FETs 181 and 183, respectively. A source of the FET 183 is connected to ground GND. Reference numeral 182 designates a diode coupled depletion type FET having a drain connected to a power supply $V_{DD}$ and a source connected to a drain of the FET 181. The FET 182 serves as a load for supplying current to the FETs 181 and 183. When "H" signals are applied to the input terminals IN1 and IN2, a "L" signal is output from the junction of the drain of the FET 181 and the source of the FET 182.

Figure 8:
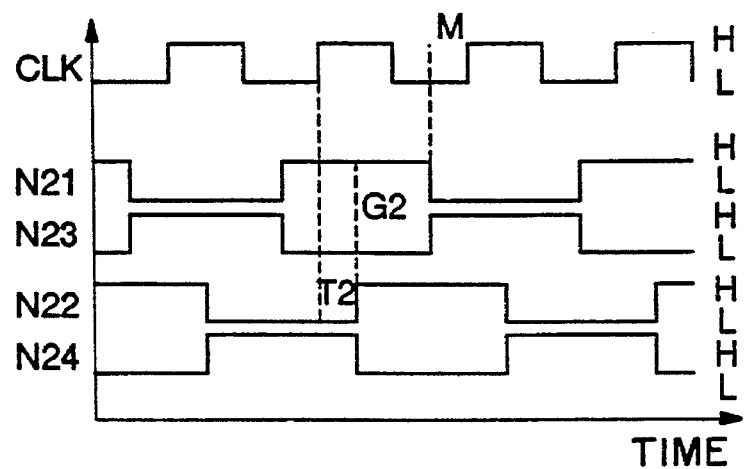
FIG. 8 is a timing chart of the frequency divider of FIG. 5.

FIG. 8 is a timing chart of each of the frequency dividers shown in FIGS. 5, 6, and 7. Hereinafter, the operation of the frequency divider shown in FIG. 5 will be described using the timing chart of FIG. 8.

The single phase clock CLK alternates between "H" level and "L" level at constant frequency. When the clock CLK is at "L" level and the nodes N21 and N23 are at "H" level and "L" level, respectively, the transmission gates T2 and T3 are in the OFF state, so that signals "H" and "L" at the nodes N21 and N23 are not transferred to the nodes N22 and N24, respectively. When the clock CLK is inverted to "H" level, the transmission gates T2 and T3 are turned on, and transfer of the signals "H" and "L" at the nodes N21 and N23 starts. After the inversion of the clock CLK to "H" level, inversion of the node N22 (N24) to "H" level ("L" level) is delayed by the delay time of the transmission gate T2 (T3). The signals "H" and "L" at the nodes N22 and N24 are amplified by the noninverting logic circuit G2. Since the outputs of the noninverting logic circuit G2 are cross-connected to the nodes N21 and N23, the nodes N21 and N23 are inverted to "L" level and "H" level, respectively, after a time interval equivalent to the delay time of the noninverting logic circuit G2. At this time, if the clock CLK is at "L" level, the signals "L" and "H" at the nodes N21 and N23 are not transferred to the nodes N22 and N24, respectively. When the clock CLK is inverted to "H" level, transfer of the signals "L" and "H" at the nodes N21 and N23 toward the nodes N22 and N24, respectively, starts. In this way, the signals at the nodes N21 and N23 are inverted during one period of the clock.

As described above, the nodes N21 and N23 are changed from "H" level and "L" level to "L" level and "H" level, respectively, during one period of the clock CLK, and a signal having a frequency equivalent to ½ of the frequency of the clock CLK is produced.

In order to accurately operate the frequency divider according to this second embodiment, the following conditions must be satisfied.

For the same reason as described with respect to the prior art frequency divider, the total of the delay times of the transmission gate T2 and the noninverting logic circuit G2 and the total of the delay times of the transmission gate T3 and the noninverting logic circuit G2 must be shorter than the period of the clock CLK. This is the first condition.

The second condition described in the following is peculiar to this second embodiment of the invention. After the inversion of the clock CLK to "H" level, the signals "H" and "L" at the nodes N21 and N23 are inverted to frequency-divided signals "L" and "H", respectively, and return to the node N21 and N23 after a time interval equivalent to the total of the delay times of the transmission gate T2 and the noninverting logic circuit G2 and the total of the delay times of the transmission gate T3 and the noninverting logic circuit G2, respectively. At this time, if the clock CLK is not at "L" level, the frequency-divided signals are not accurately produced.

Assuming that the duty ratio is 1, i.e., the time interval during which the clock CLK is at "H" level is equal to the time interval during which the clock CLK is at "L" level, the time interval during which the clock is at "H" level is equal to ½ of the period of the clock CLK. Therefore, the total of the delay times of the transmission gate T2 and the noninverting logic circuit G2 and the total of the delay times of the transmission gate T3 and the noninverting logic circuit G2 must be longer than ½ of the clock period. Further, if the duty ratio is small, i.e., when the time interval during which the clock CLK is at "H" level is shorter than the time interval during which the clock CLK is at "L" level, accurate frequency division is achieved even when the total of the delay times of the transmission gate T2 and the noninverting logic circuit G2 and the total of the delay times of the transmission gate T3 and the noninverting logic circuit G2 are shorter than ½ of the clock period.

As the result, if the duty ratio of the clock CLK is 1, the total of the delay times of the transmission gate T2 and the noninverting logic circuit G2 and the total of the delay times of the transmission gate T3 and the noninverting logic circuit G2 must be shorter than the clock period and longer than ½ of the clock period.

The upper limit of the operating frequency of the frequency divider is determined by the above-described condition that the total of the delay times of the transmission gate T2 and the noninverting logic circuit G2 and the total of the delay times of the transmission gate T3 and the noninverting logic circuit G2 should be shorter than the clock period, and the lower limit of the operating frequency of the circuit is determined by the condition that the above-described total delay times should be longer than ½ of the clock frequency. Therefore, assuming that the total of the delay times of the transmission gate T2 (T3) and the noninverting logic circuit G2 is 100 psec., the upper limit of the operating frequency is $1/(100 \times 10^{-12})=10$ GHz, and the lower limit is 5 GHz.

A description is given of comparison between the frequency divider of this second embodiment and the prior art circuit. In the prior art frequency divider, the total of the delay times of two transmission gates and two logic circuits should be shorter than the clock period. In the frequency divider of this embodiment, the total of the delay times of one transmission gate and one logic circuit should be shorter than the clock period. Assuming that both the circuit of this embodiment and the prior art circuit include the same transmission gates and the same logic circuits, the frequency divider of this second embodiment performs accurate frequency division with a clock of shorter period (about ½ period) than the clock period employed in the prior art circuit. In other words, accurate frequency division is realized with a higher clock frequency. Further, since the negative phase clock signal can be dispensed with in the frequency divider of this first embodiment, the generation of the clock signal is facilitated. Furthermore, the number of the constituent elements is significantly decreased compared to the prior art circuit.

While in the above-described second embodiment of the invention a DCFL circuit is employed as the inverting logic circuit, a CMOS inverter including an ordinary transistor may be employed with the same effects as described above.

Further, in place of the noninverting logic circuit G2 shown in FIG. 5, a latch circuit comprising two two-input NOR logic circuits may be employed as shown in FIG. 6.

More specifically, in FIG. 6, a first input terminal of a two-input NOR circuit G3 is connected to the output terminal of the transmission gate T2 and an output terminal of the NOR circuit G3 is connected to the input terminal of the transmission gate T2. A first input terminal of a two-input NOR circuit G4 is connected to the output terminal of the transmission gate T3 and an output terminal of the NOR circuit G4 is connected to the input terminal of the transmission gate T3. A second input terminal of the two-input NOR circuit G3 is connected to the output terminal of the NOR circuit G4, and a second input terminal of the two-input NOR circuit G4 is connected to the output terminal of the NOR circuit G3.

Generally, it is difficult to put the transmission gate in a completely OFF state, i.e., in a state where the input signal never affects the output signal. If the clock is in the "L" state for a long time, the input signal unfavorably leaks from the output terminal. However, the latch circuit shown in FIG. 6 reduces the leakage, whereby malfunctioning of the frequency divider is avoided. In place of the two-input NOR logic circuits G3 and G4 shown in FIG. 6, two two-input NAND logic circuits G25 and G26 may be employed as shown in FIG. 7. Also in this case, the same operation and effect as described above are achieved.

Figure 19:
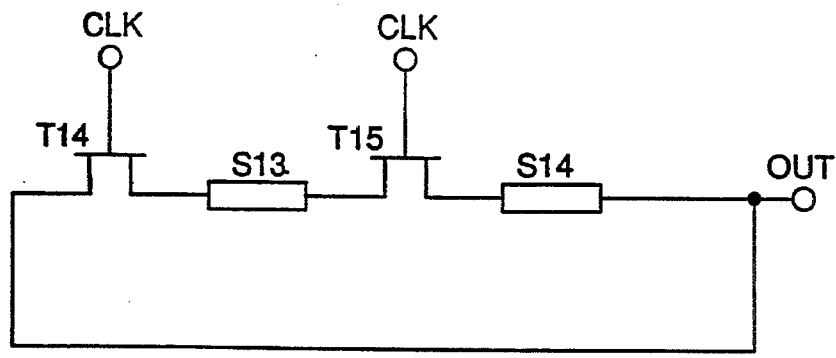
FIG. 19 is a circuit diagram illustrating a frequency divider in accordance with a third embodiment of the present invention.

FIG. 19 is a circuit diagram illustrating a frequency divider in accordance with a third embodiment of the present invention.

The frequency divider of this third embodiment is a further developed version of the frequency divider according to the first embodiment of the invention shown in FIG. 1. While the frequency divider according to the first embodiment performs ½ frequency division, the circuit of this third embodiment performs ¼ frequency division.

In the frequency divider shown in FIG. 19, a circuit comprising a transmission gate T14 and a delay and amplification element S13 is added to the circuit structure shown in FIG. 1. In FIG. 19, a transmission gate T15 corresponds to the transmission gate T1 of FIG. 1, and an inversion . delay . amplification element S14 corresponds to the element S1 of FIG. 1. Two clocks CLK of the same phase are respectively input to the transmission gates T14 and T15.

Figure 20:
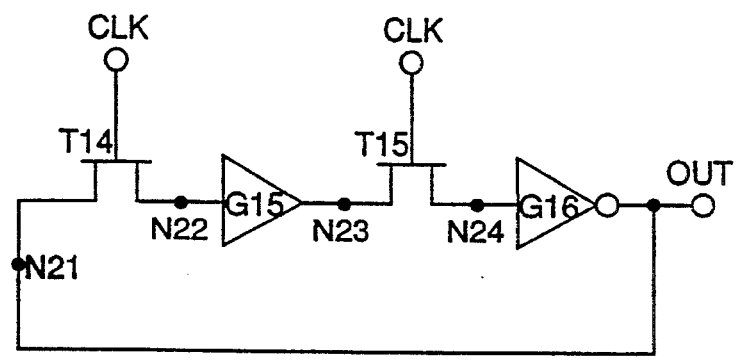
FIG. 20 is a circuit diagram illustrating the frequency divider of FIG. 19 including a noninverting logic circuit and an inverting logic circuit.

FIG. 20 illustrates an example of the frequency divider of FIG. 19 in which an inverting logic circuit is used as the element S14 having functions of inversion, delay, and amplification and a noninverting logic circuit is used as the element S13 having functions of delay and amplification.

Figure 23:
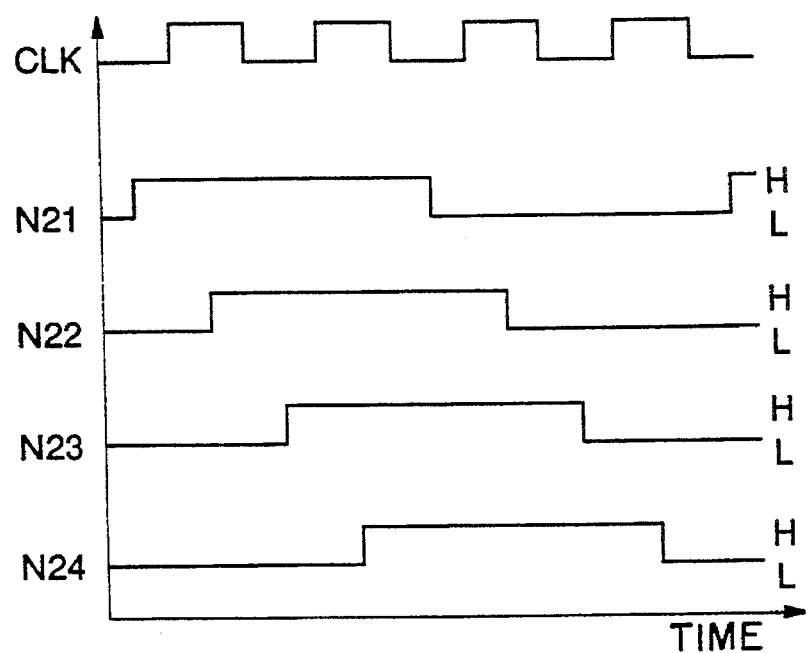
FIG. 23 is a timing chart of the frequency divider of FIG. 20.

FIG. 23 is a timing chart of the frequency divider shown in FIG. 20. Hereinafter, the operation of the frequency divider will be described using FIG. 23.

The single phase clock CLK alternates between "H" level and "L" level at constant frequency. When the clock CLK is at "L" level and the node N21 is at "H" level, the transmission gate T14 is in the OFF state, so that the signal "H" at the node N21 is not transferred to the node N22. When the clock CLK is inverted to "H" level, the transmission gate T14 is turned on, and transfer of the signal "H" at the node N21 starts. That is, after the inversion of the clock CLK to "H" level, inversion of the node N22 to "H" level is delayed by the delay time of the transmission gate T14. The signal "H" at the node N22 is amplified by the noninverting logic circuit G15, and the node N23 is turned to "H" level after a time interval equivalent to the delay time of the noninverting logic circuit G15. At this time Since the clock CLK is at "L" level, the signal "H" at the node N23 is not transferred to the node N24. When the clock CLK is inverted to "H" level, the transmission gate T15 is turned on, and transfer of the signal 'H" at the node N23 toward the node N24 starts.

The signal "H" at the node N24 is inverted and amplified by the inverting logic circuit G16, and the node N21 is turned to "L" level after a time interval equivalent to the delay time of the inverting logic circuit G16. At this time, since the clock CLK is at "L" level, the signal "L" at the node N21 is not transferred to the node N22. When the clock CLK is inverted to "H" level, transfer of the signal "L" at the node N21 toward the node N22 starts. In this way, the signal at the node N22 is inverted during two periods of the clock CLK.

As described above, the node N21 changes from "H" level to "L" level during two periods of the clock CLK, and a signal having a frequency equivalent to ¼ of the frequency of the clock CLK is produced.

In order to accurately operate the frequency divider according to this third embodiment, the following conditions must be satisfied.

For the same reason as described in the first embodiment, the total of the delay times of the transmission gate T14 and the noninverting logic circuit G15 should be shorter than one period of the clock CLK, and the total of the delay times of the transmission gate T15 and the inverting logic circuit G16 should be shorter than one period of the clock CLK. This is the first condition.

The second condition described in the following is peculiar to this third embodiment of the invention. After the inversion of the clock CLK to "H" level, the signal "H" at the node N21 is inverted to a frequency-divided signal "L" while traveling through the transmission gate T14, the inverting logic circuit G15, the transmission gate T15, and the inverting logic circuit G16, and this signal "L" returns to the node N21. In this operation, if the clock CLK is not at "L" level when the signal has just passed through the inverting logic circuit G15 and when the signal has just passed through the transmission gate T15 and the inverting logic circuit G16, the frequency-divided signal is not accurately produced.

Assuming that the duty ratio be 1, i.e., the time interval during which the clock CLK is at "H" level be equal to the time interval during which the clock CLK is at "L" level, the time interval during which the clock is at "H" level is equal to ½ of the period of the clock CLK. Therefore, the total of the delay times of the transmission gate T14 and the inverting logic circuit G15 must be longer than ½ of the clock period, and the total of the delay times of the transmission gate T15 and the inverting logic circuit G16 must be longer than ½ of the clock period. Further, if the duty ratio is small, i.e., the time interval during which the clock CLK is at "H" level is shorter than the time interval during which the clock CLK is at "L" level, accurate frequency division is carried out even when the total of the delay times of the transmission gate T14 and the inverting logic circuit G15 is shorter than ½ of the clock period and the total of the delay times of the transmission gate T15 and the inverting logic circuit G16 is shorter than ½ of the clock signal.

As the result, if the duty ratio of the clock CLK is 1, the total of the delay times of the transmission gate T14 and the inverting logic circuit G15 and the total of the delay times of the transmission gate T15 and the inverting logic circuit G16 must be shorter than one clock period and longer than ½ of the clock period.

The upper limit of the operating frequency of this frequency divider is determined by the above-described condition that the total of the delay times of the transmission gate T14 and the inverting logic circuit G15 and the total of the delay times of the transmission gate T15 and the inverting logic circuit G16 should be shorter than one clock period. The lower limit of the operating frequency of this circuit is determined by the above-described condition that the total of the delay times of the transmission gate T14 and the inverting logic circuit G15 and the total of the delay times of the transmission gate T15 and the inverting logic circuit G16 should be longer than ½ of the clock period. Therefore, assuming that, for example, the total of the delay times of the transmission gate T14 and the inverting logic circuit G15 is 100 psec., the upper limit of the operating frequency is $1/(100\times10^{-12})=10$ GHz, According to the above-described third embodiment, in the circuit structure according to the first embodiment of the invention including the transmission gate T15 (T1 in FIG. 1) and the inversion . delay . amplification element S14 (S1 in FIG. 1), the transmission gate T14 operating with a clock of the same phase as the clock input to the transmission gate T15 and the element S13 having functions of delay and amplification are added. Therefore, by adding a few elements (the transmission gate T15 and the element S13), the frequency of the clock is reduced to ¼ without using a clock of opposite phase. In addition, the frequency divided signals are accurately produced even with high clock frequency.

While in the above-described third embodiment of the invention a DCFL circuit is employed as the inverting logic circuit, a CMOS inverter including an ordinary transistor may be employed. Also in this case, the same effects as described above are achieved.

Figure 25:
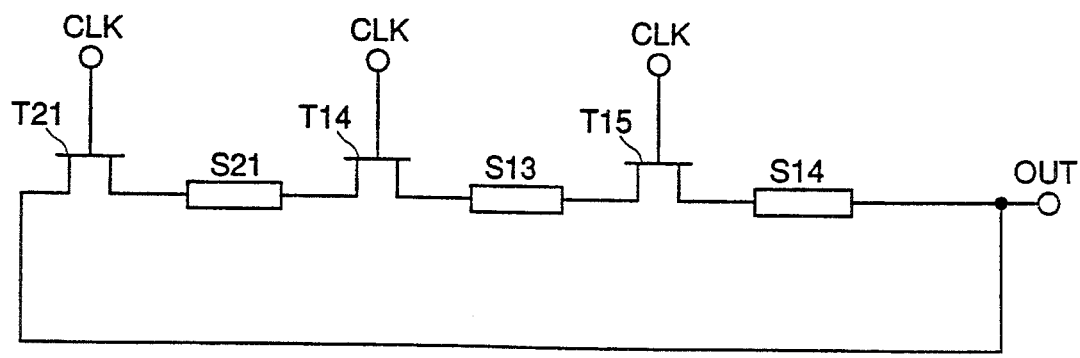
FIG. 25 is a circuit diagram illustrating the frequency divider shown in FIG. 20 that is modified so that ⅙ frequency division is realized.

Although the frequency divider according to the third embodiment performs ¼ frequency division, when a series circuit comprising a transmission gate T21 and a delay and amplification element S21 is added as shown in FIG. 25, a frequency divider performing ⅙ frequency division is realized.

Furthermore, by increasing the number of series circuits comprising a transmission gate and a delay and amplification element in the frequency divider shown in FIG. 25, frequency dividers performing ½(n+1) frequency division are realized (n=integer equal to the number of the stages of the series circuits).

Figure 21:
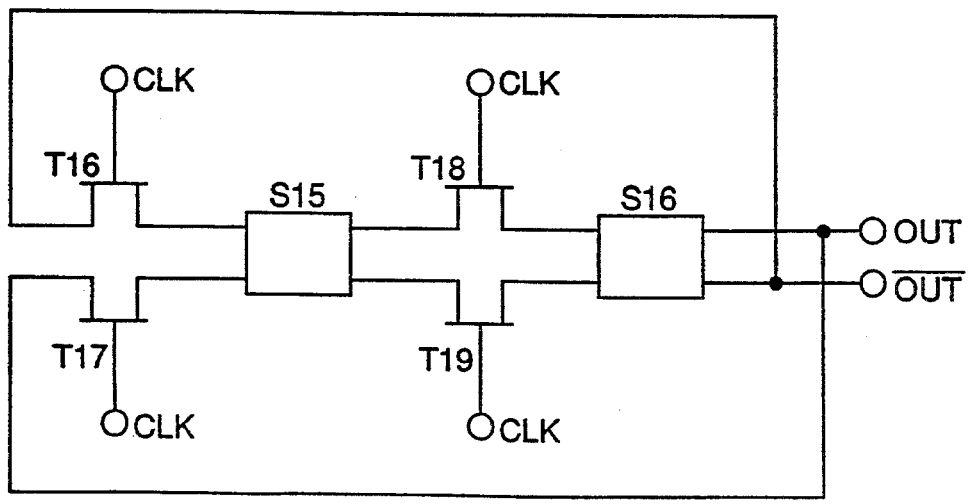
FIG. 21 is a circuit diagram illustrating a frequency divider in accordance with a fourth embodiment of the present invention.

FIG. 21 is a circuit diagram illustrating a frequency divider in accordance with a fourth embodiment of the present invention. The frequency divider of this fourth embodiment is a further developed version of the frequency divider according to the second embodiment shown in FIG. 4. While the frequency divider of the second embodiment performs ½ frequency division, the circuit of this fourth embodiment performs ¼ frequency division.

In FIG. 21, transmission gates T18 and T19 correspond to the transmission gates T2 and T3 of FIG. 4, and an element S16 having functions of delay and amplification corresponds to the element S2 of FIG. 4. Furthermore, two additional transmission gates T16 and T17 and an additional delay and amplification element S15 are added to the circuit structure of FIG. 4.

Figure 22:
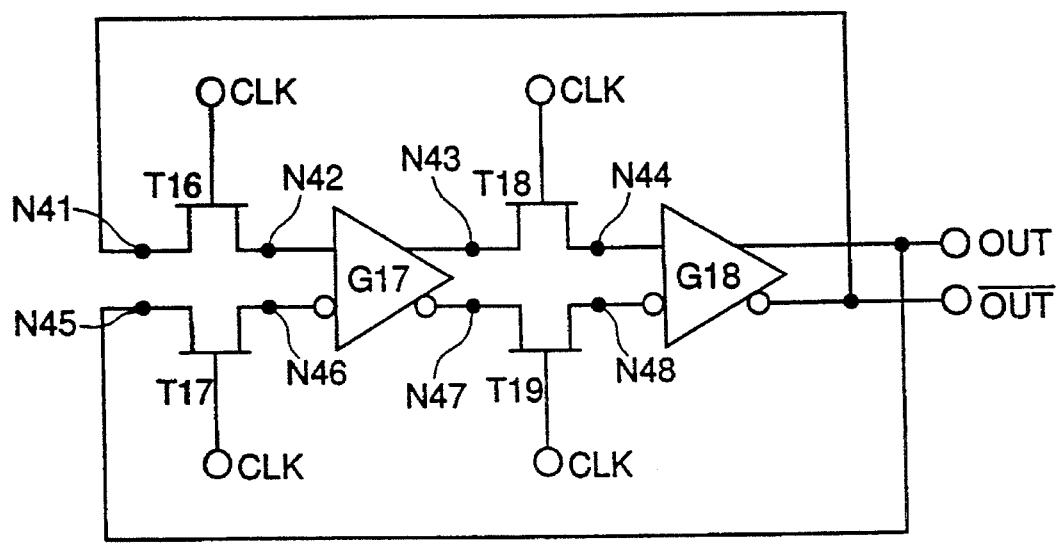
FIG. 22 is a circuit diagram illustrating the frequency divider of FIG. 21 including a complementary input and output noninverting logic circuit.

FIG. 22 illustrates an example of the frequency divider shown in FIG. 21 in which complementary input and output noninverting logic circuits G17 and G18 are employed as the delay and amplification elements S15 and S16.

Figure 24:
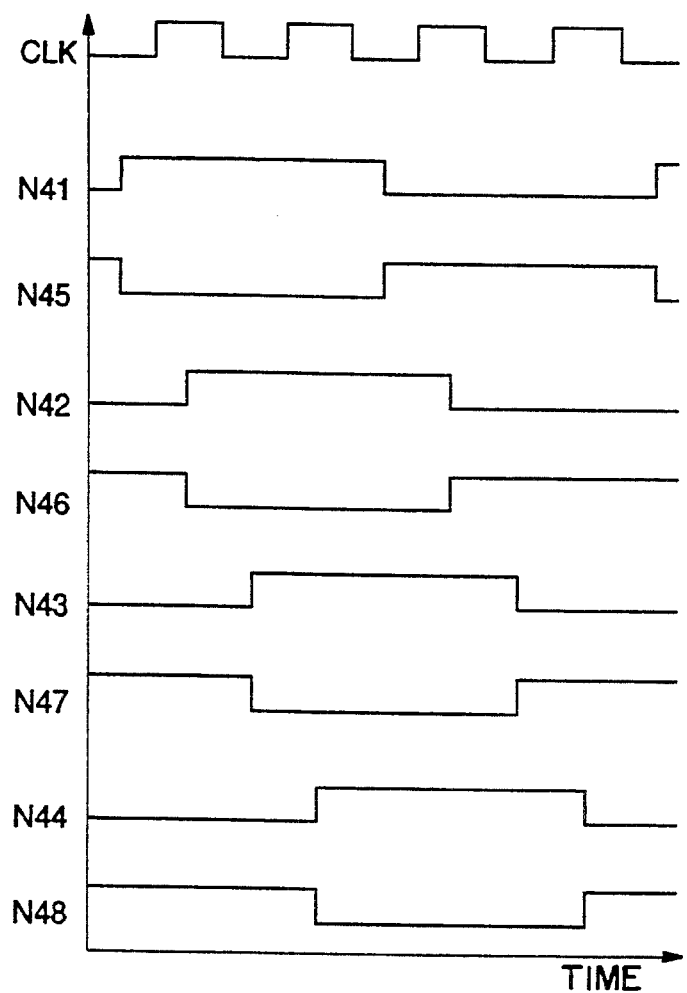
FIG. 24 is a timing chart of the frequency divider of FIG. 22.

FIG. 24 illustrates a timing chart of the frequency divider shown in FIG. 22.

The single phase clock CLK alternates between "H" level and "L" level at constant frequency. When the clock CLK is at "L" level and the nodes N41 and N45 are at "H" level and "L" level, respectively, the transmission gates T16 and T17 are in the OFF state, so that signals "H" and "L" at the nodes N41 and N45 are not transferred to the nodes N42 and N46, respectively. When the clock CLK is inverted to "H" level, the transmission gates T16 and T17 are turned on, and transfer of the signals "H" and "L" at the nodes N41 and N45 starts. That is, after the inversion of the clock CLK to "H" level, inversion of the node N22 (N24) to "H" level ("L" level) is delayed by the delay time of the transmission gate T16 (T17). Thereafter, signals "H" and "L" at the nodes N42 and N46 are amplified by the noninverting logic circuit G17, and the nodes N42 and N47 are inverted to "H" level and "L" level, respectively, after a time interval equivalent to the delay time of the noninverting logic circuit G17. At this time, since the clock CLK is at "L" level, signals "H" and "L" at the nodes N43 and N47 are not transferred to the nodes N44 and N48, respectively. When the clock CLK is inverted to "H" level, the transmission gates T18 and T19 are turned on, and the signals "H" and "L" at the nodes N43 and N47 are transferred toward the nodes N44 and N48.

The signals "H" and "L" at the nodes N44 and N48 are amplified by the noninverting logic circuit G18, and the nodes N41 and N45 are inverted to "L" level and "H" level, respectively, after a time interval equivalent to the delay time of the noninverting logic circuit G18 because the complementary output terminals of the circuit G18 are cross-connected to the nodes N41 and N45. At this time, since the clock CLK is at "L" level, signals "L" and "H" at the nodes N41 and N45 are not transferred to the nodes N42 and N46, respectively. When the clock CLK is inverted to "H" level, signals "L" and "H" at the nodes N41 and N45 are transferred toward the nodes N42 and N46, respectively. In this way, signals at the nodes N42 and N46 are inverted during two periods of the clock CLK.

As described above, the nodes N41 and N45 are changed from "H" and "L" to "L" and "H", respectively, during a time interval equivalent to two periods of the clock CLK, whereby a signal having a frequency equivalent to ¼ of the frequency of the clock CLK is produced.

In order to accurately operate the frequency divider according to this fourth embodiment, the following conditions must be satisfied.

For the same reason as described with respect to the second embodiment of the invention, the total of the delay times of the transmission gate T16 and the noninverting logic circuit G17, the total of the delay times of the transmission gate T18 and the inverting logic circuit G18, the total of the delay times of the transmission gate T17 and the noninverting logic circuit G17, and the total of the delay times of the transmission gate T19 and the inverting logic circuit G18 must be shorter than one cycle of the clock CLK. This is the first condition.

The second condition described in the following is peculiar to this fourth embodiment of the invention. After the inversion of the clock CLK to "H" level, the signal "L" at the node N41 is inverted to a frequency-divided signal "H" while traveling through the transmission gate T16, the noninverting logic circuit G17, the transmission gate T18, and the noninverting logic circuit G18, and this signal "H" returns to the node N45. In this operation, if the clock CLK is not at "L" level when the signal has just passed through the transmission gate T16 and the noninverting logic circuit G17 and when the signal has just passed through the transmission gate T18 and the noninverting logic circuit G16, the frequency divided signal is not accurately produced.

Further, after the inversion of the clock CLK to "H" level, the signal "L" at the node N45 is inverted to a frequency-divided signal "H" while traveling through the transmission gate T17, the noninverting logic circuit G17, the transmission gate T19, and the noninverting logic circuit G18, and this signal "H" returns to the node N41. In this operation, if the clock CLK is not at "L" level when the signal has just passed through the transmission gate T17 and the noninverting logic circuit G17 and when the signal has just passed through the transmission gate T19 and the noninverting logic circuit G18, the frequency divided signal is not accurately produced.

Assuming that the duty ratio is 1, i.e., the time interval during which the clock CLK is at "H" level is equal to the time interval during which the clock CLK is at "L" level, the time interval during which the clock is at "H" level is equal to ½ of one period of the clock CLK. Therefore, the total of the delay times of the transmission gate T16 and the noninverting logic circuit G17 should be longer than ½ of one clock period, and the total of the delay times of the transmission gate T18 and the noninverting logic circuit G18 should be longer than ½ of the clock period. Further, the total of the delay times of the transmission gate T17 and the noninverting logic circuit G17 should be longer than ½ of the clock period, and the total of the delay times of the transmission gate T19 and the noninverting logic circuit G18 should be longer than ½ of the clock period.

When the duty ratio is small, i.e., the time interval during which the clock CLK is at "H" level is shorter than the time interval during which the clock CLK is at "L" level, accurate frequency division is achieved even when the total of the delay times of the transmission gate T16 and the noninverting logic circuit G17, the total of the delay times of the transmission gate T18 and the noninverting logic circuit G18, the total of the delay times of the transmission gate T17 and the noninverting logic circuit G17, and the total of the delay times of the transmission gate T19 and the noninverting logic circuit G18 are shorter than ½ of the clock period.

As the result, when the duty ratio of the clock CLK is 1, the total of the delay times of the transmission gate T16 and the noninverting logic circuit G17, the total of the delay times of the transmission gate T18 and the noninverting logic circuit G18, the total of the delay times of the transmission gate T17 and the noninverting logic circuit G17, and the total of the delay times of the transmission gate T19 and the noninverting logic circuit G18 should be shorter than one clock period and longer than ½ of the clock period.

The upper limit of the operating frequency of the frequency divider is determined by the above-described condition that the total of the delay times of the transmission gate T16 and the noninverting logic circuit G17, the total of the delay times of the transmission gate T18 and the noninverting logic circuit G18, the total of the delay times of the transmission gate T17 and the noninverting logic circuit G17, and the total of the delay times of the transmission gate T19 and the noninverting logic circuit G18 should be shorter than one clock period. On the other hand, the lower limit of the operating frequency of the frequency divider is determined by the above-described conditions that the total of the delay times of the transmission gate T16 and the noninverting logic circuit G17, the total of the delay times of the transmission gate T18 and the noninverting logic circuit G18, the total of the delay times of the transmission gate T17 and the noninverting logic circuit G17, and the total of the delay times of the transmission gate T19 and the noninverting logic circuit G18 should be longer than ½ of the clock period.

Therefore, assuming that, for example, the total of the delay times of the transmission gate T16 and the noninverting logic circuit G17 is 100 psec., the upper limit of the operating frequency is $1/(100 \times 10^{-12})=10$ GHz, and the lower limit is 5 GHz.

According to the above-described fourth embodiment of the present invention, in the circuit structure according to the second embodiment shown in FIG. 4 including the transmission gates T18 and T19 (T2 and T3 in FIG. 4) and the delay and amplification element S16 (S2 in FIG. 4), the series circuit comprising the transmission gates T16 and T17 that operate with clocks of the same phases as the clocks input to the transmission gates T18 and T19 and the delay and amplification element S15 are added. Therefore, by adding a few elements (transmission gates T18 and T19 and the element S15), a frequency divider that reduces the frequency of the clock to ¼ is realized without using a clock of opposite phase. In addition, the frequency divided signal is produced accurately even with a high clock frequency.

While in the above-described fourth embodiment of the invention an SCFL circuit is employed as the complementary input-output noninverting logic circuit, a CMOS inverter including an ordinary transistor may be employed. Also in this case, the same effects as described above are achieved.

Figure 26:
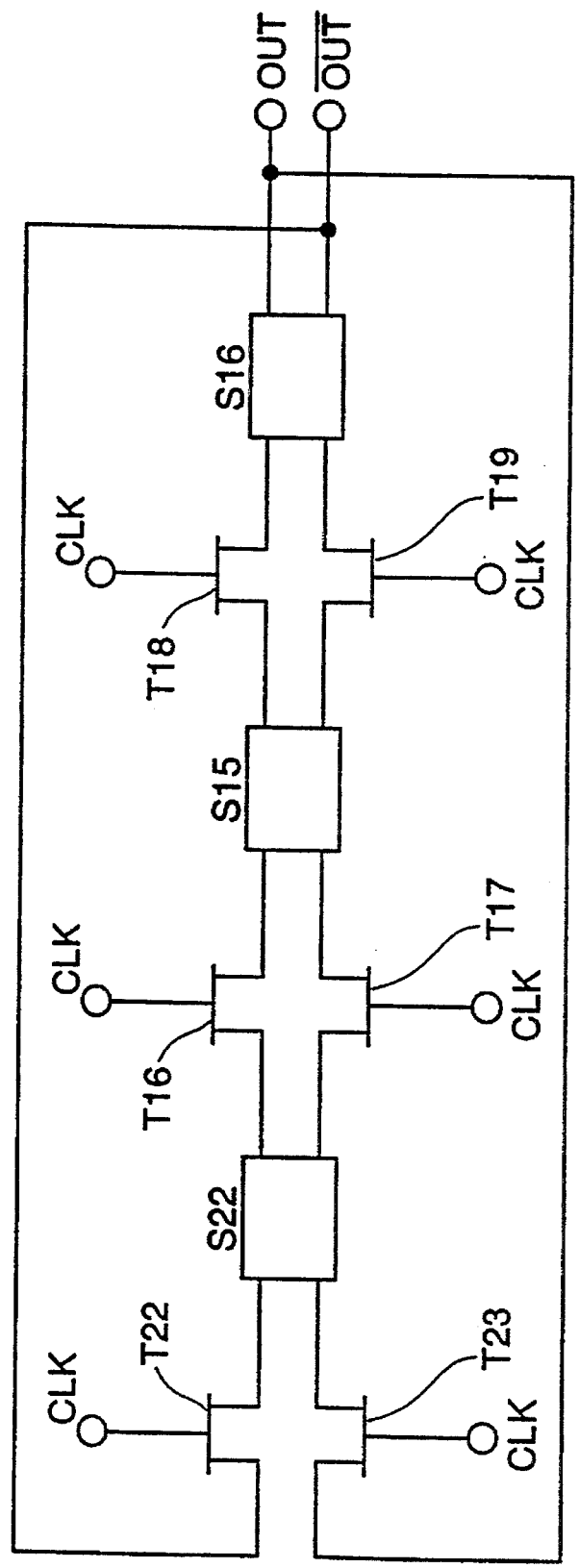
FIG. 26 is a circuit diagram of the frequency divider of FIG. 22 that is modified so that ⅙ frequency division is realized.

Although the frequency divider according to the fourth embodiment performs ¼ frequency division, when a series circuit comprising two transmission gates T22 and T23 and a delay and amplification element S21 is added as shown in FIG. 26, a frequency divider performing ⅙ frequency division is realized.

Furthermore, by increasing the number of series circuits comprising two transmission gates and a delay and amplification element in the frequency divider shown in FIG. 26, frequency dividers performing ½(n+1) frequency division are realized (n=integer equal to the number of the stages of the series circuits).

Furthermore, in the frequency divider including a plurality of circuits each comprising two transmission gates and a delay and amplification element as shown in FIG. 26, each delay and amplification element other than that at the final stage may comprise a latch circuit comprising two two-input NOR circuits or two two-input NAND circuits.

What is claimed is:

1. A frequency divider comprising:

a first transmission gate having input and output terminals and a gate terminal, the first transmission gate being turned on and off in response to a single-phase clock signal input to the gate terminal, the single-phase clock signal having a frequency, a first logic level turning on the first transmission gate, and a second logic level turning off the first transmission gate, the first transmission gate having a delay time so that transmission of a signal from the input terminal to the output terminal, upon application of the single-phase clock signal at the first logic level to the gate terminal, is delayed;

a first element having a first element input terminal directly connected to the output terminal of the first transmission gate and a first element output terminal for non-inversion and amplification of a signal input to the first element input terminal, the first element having a delay time so that transmission of a signal from the first element input terminal to the first element output terminal is delayed;

a second transmission gate having input and output terminals and a gate terminal, the input terminal of the second transmission gate being directly connected to the element output terminal of the first element, the gate terminal of the second transmission gate receiving the single-phase clock signal, the second transmission gate being turned on in response to the first logic level and off in response to the second logic level, the second transmission gate having a delay time so that transmission of a signal from the input terminal to the output terminal, upon application of the single-phase clock signal at the first logic level to the gate terminal, is delayed;

a second element having a second element input terminal directly connected to the output terminal of the second transmission gate and a second element output terminal for inversion and amplification of a signal input to the second element input terminal, the second element having a delay time so that transmission of a signal from the second element input terminal to the second element output terminal is delayed; and a frequency divider output terminal directly connected to the second element output terminal and to the input terminal of the first transmission gate for outputting a divided signal having a frequency equal to ½(n+1) (n=integer larger than zero) of the frequency of the single-phase clock signal, wherein the delay times of the first transmission gate and the first element added together and the delay times of the second transmission gate and the second element added together are each shorter than one period of the single-phase clock signal and longer than the first logic level within one period of the single-phase clock signal.

2. A frequency divider comprising:

first and second transmission gates, each of the first and second transmission gates having respective input and output terminals and a gate terminal, each of the first and second transmission gates being turned on and off by a single-phase clock signal having a frequency and applied to the gate terminals, the single-phase clock signal having a first logic level turning on the first and second transmission gates and a second logic level turning off the first and second transmission gates, each of the first and second transmission gates having a delay time so that transmission of a signal from the input terminal of a respective transmission gate to the output terminal of that transmission gate, upon application of the single-phase clock signal at the first logic level to the respective gate terminal, is delayed;

an element having a noninverting element input terminal and an inverting element input terminal, the noninverting and inverting input terminals being directly and respectively connected to the output terminals of the first and second transmission gates, and a noninverting element output terminal and inverting element output terminal, the noninverting and inverting element output terminals being directly and respectively connected to the input terminals of the second and first transmission gates for amplification of signals input to the inverting and noninverting element input terminals, the element having a delay time so that transmission of a signal from an element input terminal to the corresponding element output terminal is delayed; and first and second frequency divider output terminals connected to the noninverting and inverting element output terminals for outputting respective divided signals having opposite phases and a frequency equal to 1/n (n=integer) of the frequency of the single-phase clock signal wherein the delay times of the first transmission gate and the element added together and the delay times of the second transmission gate and the element added together are each shorter than one period of the single-phase clock signal and longer than the first logic level within one period of the single-phase clock signal.

3. The frequency divider of claim 2 wherein the element comprises a logic circuit.

4. A frequency divider comprising:

first and second transmission gates, each of the first and second transmission gates having respective input and output terminals and a gate terminal, and each of the first and second transmission gates being turned on and off by a single-phase clock signal having a frequency and applied to the gate terminals, the clock signal having a first logic level turning on the first and second transmission gates and a second logic level turning off the first and second transmission gates, each of the first and said transmission gates having a delay time so that transmission of a signal from the input terminal of the respective transmission gate to the output terminal of that transmission gate, upon application of the clock signal at the first logic level to the respective gate terminal, is delayed;

a first element having a noninverting first element input terminal and an inverting first element input terminal, the noninverting and inverting first element input terminals being directly and respectively connected to the output terminals of the first and second transmission gates, and a noninverting first element output terminal and an inverting first element output terminal for amplification of signals input to the noninverting and inverting first element input terminals, the first element having a delay time so that transmission of a signal from a first element input terminal to that corresponding first element output terminal is delayed;

third and fourth transmission gates, each of the third and fourth transmission gates having respective input and output terminals and a gate terminal, the input terminals of the third and fourth transmission gates being directly and respectively connected to the noninverting first element output and inverting first element output terminals, the gate terminals of the third and fourth transmission gates receiving the clock signal, the third and fourth transmission gates being turned on in response to the first logic level and off in response to the second logic level;

a second element having a noninverting second element input terminal and an inverting second element input terminal, the noninverting and inverting second element input terminals being directly and respectively connected to the output terminals of the third and fourth transmission gates, and a noninverting second element output terminal and an inverting second element output terminal, the noninverting and inverting second element output terminals being directly and respectively connected to the input terminals of the second and first transmission gates for amplification of signals input to the noninverting and inverting second element input terminals, the second element having a delay time so that transmission of a signal from a second element input terminal to the corresponding second element output terminal is delayed; and first and second frequency divider output terminals connected to the noninverting and inverting second element output terminals for outputting signals having opposite phases and a frequency equal to ½(n=integer larger than zero) of the frequency of the clock signal wherein the delay times of the first transmission gate and the first element added together, the delay times of the second transmission gate and the first element added together, the delay times of the third transmission gate and the second element added together, and the delay times of the fourth transmission gate and the second transmission element added together are each shorter than one period of the clock signal and longer than the first logic level within one period of the clock signal.

5. The frequency divider of claim 4 wherein the first and second elements comprise first and second logic circuits.

6. The frequency divider of claim 4 wherein the first element comprises first and second two-input NOR logic circuits, each of the first and second two-input NOR logic circuits having two input terminals and an output terminal and wherein the first input terminal of the first two-input NOR logic circuit is directly connected to the output terminal of the first transmission gate, the second input terminal of the first two-input NOR logic circuit is directly connected to the output terminal of the second two-input NOR logic circuit, the first input terminal of the second two-input NOR logic circuit is directly connected to the output terminal of the second transmission gate, the second input terminal of the second two-input NOR logic circuit is directly connected to the output terminal of the first two-input NOR logic circuit, the output terminal of the first two-input NOR logic circuit is directly connected to the input terminal of the third transmission gate, and the output terminal of the second two-input NOR logic circuit is directly connected to the input terminal of the fourth transmission gate.

7. The frequency divider of claim 4 wherein the first element comprises first and second two-input NAND circuits, each of the first and second two-input NAND logic circuits having two input terminals and an output terminal and wherein the first input terminal of the first two-input NAND logic circuit is directly connected to the output terminal of the first transmission gate, the second input terminal of the first two-input NAND logic circuit is directly connected to the output terminal of the second two-input NAND logic circuit, the first input terminal of the second two-input NAND logic circuit is directly connected to the output terminal of the second transmission gate, the second input terminal of the second two-input NAND logic circuit is directly connected to the output terminal of the first two-input NAND logic circuit, the output terminal of the first two-input NAND logic circuit is directly connected to the input terminal of the third transmission gate, and the output terminal of the second two-input NAND logic circuit is directly connected to the input terminal of the fourth transmission gate.

8. A frequency divider comprising:

first and second transmission gates, each of the first and second transmission gates having input and output terminals and a gate terminal, each of the first and second transmission gate being turned on and off by a single-phase clock signal having a frequency and applied to the gate terminals, the clock signal having a first logic level turning on the first and second transmission gates and a second logic level turning off the first and second transmission gates, each of the first and said transmission gates having a delay time so that transmission of a signal from the input terminal of a respective transmission gate to the output terminal of that transmission gate, upon application of the clock signal at the first logic level to the respective gate terminal, is delayed;

first and second two-input NOR logic circuits, each of the first and second NOR logic circuit having first and second input terminals and an output terminal wherein the first input terminal of the first two-input NOR logic circuit is directly connected to the output terminal of the first transmission gate, the second input terminal of the first two-input NOR logic circuit is directly connected to the output terminal of the second two-input NOR logic circuit, the first input terminal of the second two-input NOR logic circuit is directly connected to the output terminal of the second transmission gate, the second input terminal of the second two-input NOR logic circuit is directly connected to the output terminal of the second transmission gate, the output terminal of the first two-input NOR logic circuit is directly connected to the input terminal of the first transmission gate, and the output terminal of the second two-input NOR logic circuit is directly connected to the input terminal of the second transmission gate, wherein the first and second two-input NOR logic circuits have respective delay times so that transmission of an input signal from an input terminal of a respective NOR logic circuit to the output terminal of that NOR logic circuit is delayed; and first and second frequency divider output terminals directly and respectively connected to the output terminals of the first and second two-input NOR logic circuits for outputting signals having opposite phases and a frequency equal to 1/n (n=integer) of the frequency of the clock signal wherein the delay times of the first transmission gate and the first two-input NOR logic circuit added together and the delay times of the second transmission gate and the second two-input NOR logic circuit added together are each shorter than one period of the clock signal and longer than the first logic level within one period of the clock signal.

9. A frequency divider comprising:

first and second transmission gates, each of the first and second transmission gates having input and output terminals and a gate terminal, each of the first and second transmission gate being turned on and off by a single-phase clock signal having a frequency and applied to the gate terminals, the clock signal having a first logic level turning on the first and second transmission gates and a second logic level turning off the first and second transmission gates, each of the first and said transmission gates having a delay time so that transmission of a signal from the input terminal of a respective transmission gate to the output terminal of that transmission gate, upon application of the clock signal at the first logic level to the respective gate terminal, is delayed;

first and second two-input NAND logic circuits, each of the first and second NAND logic circuit having first and second input terminals and an output terminal wherein the first input terminal of the first two-input NAND logic circuit is directly connected to the output terminal of the first transmission gate, the second input terminal of the first two-input NAND logic circuit is directly connected to the output terminal of the second two-input NAND logic circuit, the first input terminal of the second two-input NAND logic circuit is directly connected to the output terminal of the second transmission gate, the second input terminal of the second two-input NAND logic circuit is directly connected to the output terminal of the second transmission gate, the output terminal of the first two-input NAND logic circuit is directly connected to the input terminal of the first transmission gate, and the output terminal of the second two-input NAND logic circuit is directly connected to the input terminal of the second transmission gate, wherein the first and second two-input NAND logic circuits have respective delay times so that transmission of an input signal from an input terminal of a respective NAND logic circuit to the output terminal of that NAND logic circuit is delayed; and first and second frequency divider output terminals directly and respectively connected to the output terminals of the first and second two-input NAND logic circuits for outputting signals having opposite phases and a frequency equal to 1/n (n=integer) of the frequency of the clock signal wherein the delay times of the first transmission gate and the first two-input NAND logic circuit added together and the delay times of the second transmission gate and the second two-input NAND logic circuit added together are each shorter than one period of the clock signal and longer than the first logic level within one period of the clock signal.

10. A frequency divider comprising:

first and second transmission gates, each of the first and second transmission gates having respective input and output terminals and a gate terminal, each of the first and second transmission gates being turned on and off by a single-phase clock signal having a frequency and applied to the gate terminals, the clock signal having a first logic level turning on the first and second transmission gates and a second logic level turning off the first and second transmission gates, each of the first and said transmission gates having a delay time so that transmission of a signal from the input terminal of the respective transmission gate to the output terminal of that transmission gate, upon application of the clock signal at the first logic level to the respective gate terminal, is delayed;

a first element having a noninverting first element input terminal and an inverting first element input terminal, the noninverting and inverting first element input terminals being directly and respectively connected to the output terminals of the first and second transmission gates, and a first element noninverting output terminal and an inverting first element output terminal for amplification of signals input to the noninverting and inverting first element input terminals, the first element having a delay time so that transmission of a signal from a first element input terminal to the corresponding first element output terminal is delayed;

third and fourth transmission gates, each of the third and fourth transmission gates having respective input and output terminals and a gate terminal, the input terminals of the third and fourth transmission gates being directly and respectively connected to the noninverting first element output and inverting first element output terminals, the gate terminals of the third and fourth transmission gates receiving the clock signal, the third and fourth transmission gates being turned on in response to the first logic level and off in response to the second logic level;

a second element having a noninverting second element input terminal and an inverting second element input terminal, the noninverting and inverting second element input terminals being directly and respectively connected to the output terminals of the third and fourth transmission gates, and a noninverting second element output terminal and an inverting second element output terminal, the noninverting and inverting second element output terminals being directly and respectively connected to the input terminals of the first and second transmission gates for amplification of signals input to the noninverting and inverting second element input terminals, the second element having a delay time so that transmission of a signal from a second element input terminal to the corresponding second element output terminal is delayed;

fifth and sixth transmission gates, each of the fifth and sixth transmission gates having respective input and output terminals and a gate terminal, the input terminals of the fifth and sixth transmission gates being directly and respectively connected to the noninverting second element output and inverting second element output terminals, the gate terminals of the fifth and sixth transmission gates receiving the clock signal, the fifth and sixth transmission gates being turned on in response to the first logic level and off in response to the second logic level;

a third element having a noninverting third element input terminal and an inverting input third element input terminal directly and respectively connected to the output terminals of the fifth and sixth transmission gates and a noninverting third element output terminal and an inverting third element output terminal for amplification of signals input to the noninverting and inverting third element input terminals, the noninverting and inverting third element output terminals being directly and respectively connected to the input terminals of the second and first transmission gates, the third element having a delay time so that transmission of a signal from a third element input terminal to the corresponding third element output terminal is delayed;

first and second frequency divider output terminals connected to the noninverting and inverting third element output terminals for outputting signals having opposite phases and a frequency equal to ½(n+1) (n=integer where n is greater than one) of the frequency of the clock signal wherein the delay times of the first transmission gate and the first element added together, the delay times of the second transmission gate and the first element added together, the delay times of the third transmission gate and the second element added together, the delay times of the fourth transmission gate and the second element added together, the delay times of the fifth transmission gate and the third element added together, and the delay times of the sixth transmission gate and the fourth element added together are each shorter than one period of the clock signal and longer than the first logic level within one period of the clock signal.

* * * * *

UNITED STATES PATENT AND TRADEMARK OFFICE
CERTIFICATE OF CORRECTION

PATENT NO. : 5,509,040
DATED : April 16, 1996
INVENTOR(S) : Shimada

It is certified that error appears in the above-indentified patent and that said Letters Patent is hereby corrected as shown below:

On the title page item [57],

Abstract; Line 3, change "off" (first occurrence) to --on--;

Line 6, after "delay" insert --,--;

Column 24; Line 6, after "," delete --and--;

Line 62, after "1/2" insert --(n + 1)--;

Column 25; Line 29, after "NAND" insert --logic--.

Signed and Sealed this

Twenty-seventh Day of August, 1996

Attest:

BRUCE LEHMAN

Attesting Officer     Commissioner of Patents and Trademarks